US010163517B2

(12) United States Patent
Konno et al.

(10) Patent No.: US 10,163,517 B2
(45) Date of Patent: *Dec. 25, 2018

(54) SEMICONDUCTOR MEMORY DEVICE AND MEMORY SYSTEM CONFIGURED TO PERFORM TRACKING READ ON FIRST MEMORY CELLS FOLLOWED BY SHIFT READ ON SECOND MEMORY CELLS USING READ VOLTAGE CORRECTION VALUE DETERMINED DURING THE TRACKING READ

(71) Applicant: Toshiba Memory Corporation, Tokyo (JP)

(72) Inventors: Hayato Konno, Yokohama Kanagawa (JP); Yoshikazu Harada, Kawasaki Kanagawa (JP); Kosuke Yanagidaira, Fujisawa Kanagawa (JP); Jun Nakai, Yokohama Kanagawa (JP); Hiroe Kami, Fujisawa Kanagawa (JP); Yuko Utsunomiya, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/822,581

(22) Filed: Nov. 27, 2017

(65) Prior Publication Data
US 2018/0090212 A1 Mar. 29, 2018

Related U.S. Application Data

(63) Continuation of application No. 15/442,683, filed on Feb. 26, 2017, now Pat. No. 9,859,011.

(30) Foreign Application Priority Data
Aug. 19, 2016 (JP) .................................. 2016-161058

(51) Int. Cl.
*G11C 16/26* (2006.01)
*G11C 16/08* (2006.01)
(Continued)

(52) U.S. Cl.
CPC .......... *G11C 16/26* (2013.01); *G11C 16/0483* (2013.01); *G11C 16/08* (2013.01);
(Continued)

(58) Field of Classification Search
CPC ......... G11C 16/26; G11C 16/10; G11C 16/08; G11C 11/5642; G11C 16/0483
See application file for complete search history.

(56) References Cited

U.S. PATENT DOCUMENTS 7,551,478 B2 6/2009 Karino
7,929,346 B2 4/2011 Yu et al.
(Continued)

FOREIGN PATENT DOCUMENTS

WO 2014159396 A2 10/2014

OTHER PUBLICATIONS

Taiwan Office Action dated Oct. 5, 2017, filed in Taiwan counterpart Application No. 106104800, 11 pages (with translation).

*Primary Examiner* — David Lam
(74) *Attorney, Agent, or Firm* — Patterson & Sheridan, LLP

(57) ABSTRACT

A semiconductor memory device includes first, second, and third memory cells, and first, second, and third word lines that are respectively connected to gates of the first, second, and third memory cells. A control circuit executes first, second, and third read operations in response to first, second, and third command sets, respectively. The first read operation includes a first read sequence, in which the control circuit reads data by applying first to third voltages to the first word line. In the second read operation, the control
(Continued)

circuit reads data by applying a second read voltage that is set based on a result of the first read sequence, to the second word line. In the third read operation, the control circuit reads data from the third memory cells by applying a second read voltage that is set independently of the result of the first read sequence, to the third word line.

17 Claims, 26 Drawing Sheets

(51) Int. Cl.
    *G11C 16/10*     (2006.01)
    *G11C 16/04*     (2006.01)
    *G11C 16/34*     (2006.01)
    G11C 11/56     (2006.01)
    G11C 7/10     (2006.01)

(52) U.S. Cl.
    CPC .......... *G11C 16/10* (2013.01); *G11C 16/3427* (2013.01); *G11C 7/1063* (2013.01); *G11C 11/5642* (2013.01)

(56) References Cited

U.S. PATENT DOCUMENTS

| | | | |
|---|---|---|---|
| 8,681,564 B2 * | 3/2014 | Chen .................. | G11C 16/06 365/185.03 |
| 8,804,435 B2 | 8/2014 | Matsunaga | |
| 9,009,390 B2 | 4/2015 | Choi et al. | |
| 9,859,011 B1 * | 1/2018 | Konno .................. | G11C 16/26 |
| 2013/0148436 A1 | 6/2013 | Kurosawa | |
| 2014/0229131 A1 | 8/2014 | Cohen et al. | |

* cited by examiner

SEMICONDUCTOR MEMORY DEVICE AND MEMORY SYSTEM CONFIGURED TO PERFORM TRACKING READ ON FIRST MEMORY CELLS FOLLOWED BY SHIFT READ ON SECOND MEMORY CELLS USING READ VOLTAGE CORRECTION VALUE DETERMINED DURING THE TRACKING READ

CROSS-REFERENCE TO RELATED APPLICATION

This application is a continuation of U.S. patent application Ser. No. 15/442,683, filed on Feb. 26, 2017, now U.S. Pat. No. 9,859,011, which is based upon and claims the benefit of priority from Japanese Patent Application No. 2016-161058, filed Aug. 19, 2016, the entire contents of each of which are incorporated herein by reference.

FIELD

Embodiments described herein relate generally to a semiconductor memory device and a memory system.

BACKGROUND

A NAND type flash memory is known as one type of a semiconductor memory device.

DETAILED DESCRIPTION

Embodiments provide a semiconductor memory device and a memory system, which can speed up operations on the semiconductor memory device.

In general, according to an embodiment, a semiconductor memory device includes first, second, and third memory cells, and first, second, and third word lines that are respectively connected to gates of the first, second, and third memory cells. A control circuit executes first, second, and third read operations in response to first, second, and third command sets, respectively. The first read operation includes a first read sequence, in which the control circuit reads data by applying first to third voltages to the first word line. In the second read operation, the control circuit reads data by applying a second read voltage that is set based on a result of the first read sequence, to the second word line. In the third read operation, the control circuit reads data from the third memory cells by applying a second read voltage that is set independently of the result of the first read sequence, to the third word line.

In the following, embodiments will be described with reference to the drawings. The diagrams to be referred are schematic. In the following description, elements having the same function and configuration are denoted by the same reference symbol. The alphabet or number following the reference symbol is used in distinguishing among elements having the same configuration. If there is no need to distinguish the elements denoted by the same reference symbol, these elements are referred to only by reference symbol.

1. First Embodiment

In the following, a semiconductor memory device and a memory system according to a first embodiment will be described.

1-1. Configuration

1-1-1. Configuration of Memory System 1

Figure 1:
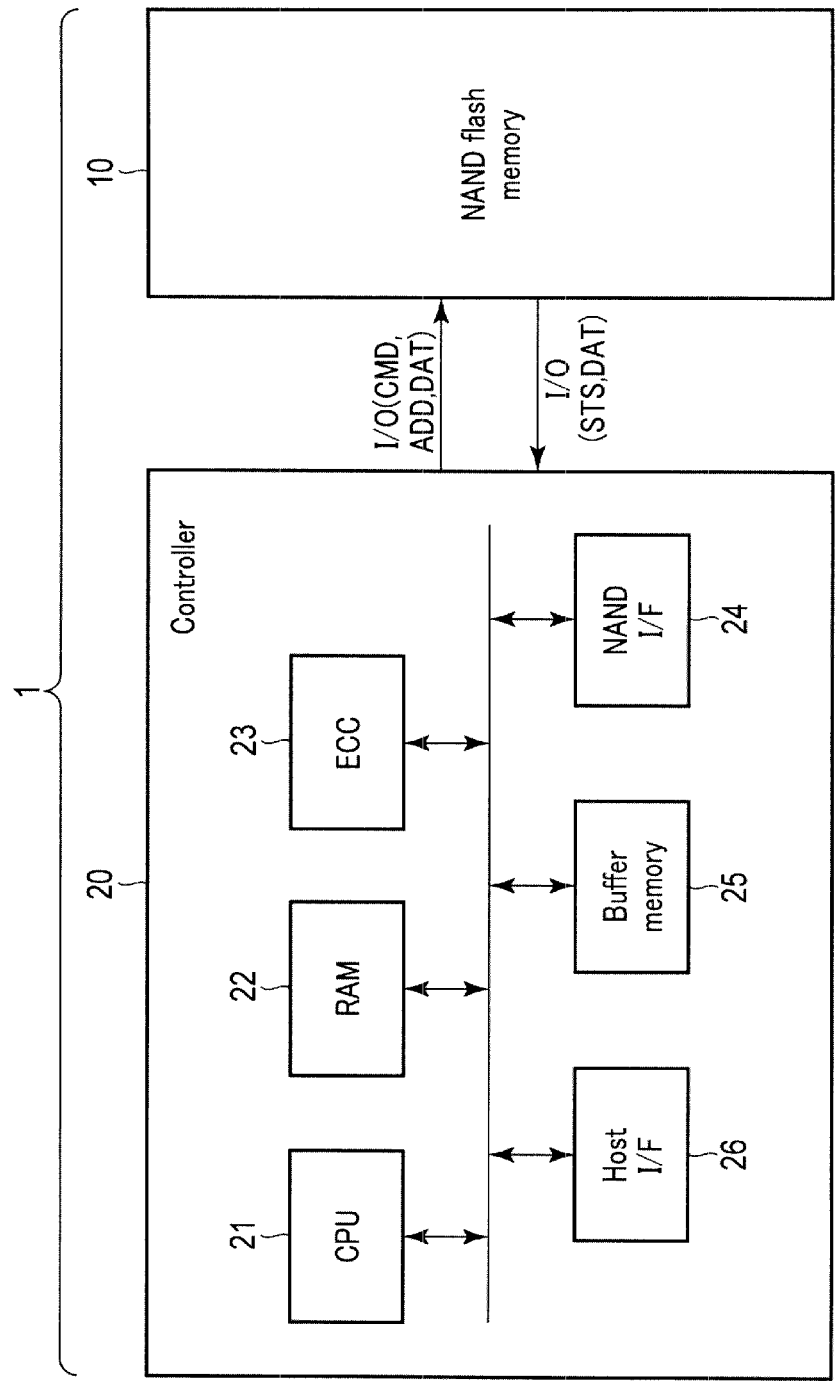
FIG. 1 is a block diagram of a memory system according to a first embodiment.

First, the configuration of a memory system will be described with reference to FIG. 1. FIG. 1 illustrates a block diagram of a memory system. As illustrated in FIG. 1, a memory system 1 includes a semiconductor memory device 10, and a controller 20.

The semiconductor memory device 10 is a NAND-type flash memory data that stores data in a nonvolatile manner. The configuration of the semiconductor memory device 10 will be described later in detail.

The controller 20 instructs the semiconductor memory device 10 to read, write, and erase data, in response to an instruction from an external host device (not illustrated). Further, the controller 20 manages the memory space of the semiconductor memory device 10.

As illustrated in FIG. 1, the controller 20 includes a processor (CPU) 21, a built-in memory (RAM) 22, an ECC circuit 23, a NAND interface circuit 24, a buffer memory 25, and a host interface circuit 26.

The processor 21 controls the operation of the entire controller 20. For example, the processor 21 issues a write instruction based on the NAND interface, in response to a write command received from the host device. This operation is also applied to reading and erasing.

The built-in memory 22 is, for example, a semiconductor memory such as a DRAM, and used as a work area for the processor 21. The built-in memory 22 retains firmware for managing the semiconductor memory device 10, various types of management tables, or the like.

The ECC circuit 23 performs an error checking and correcting (ECC) process of data. Specifically, the ECC circuit 23 generates a parity based on the write data at the time of writing data. The ECC circuit 23 generates a syndrome from the parity at the time of reading data, detects an error, and corrects the detected error.

The NAND interface circuit 24 is connected to the semiconductor memory device 10 and communicates with the semiconductor memory device 10. For example, the NAND interface circuit 24 transmits and receives an input/output signal I/O to and from the semiconductor memory device 10. For example, the input/output signal I/O that the controller 20 transmits to the semiconductor memory device 10 includes a command CMD, address information ADD, and write data DAT, and the input/output signal I/O that the controller 20 receives from the semiconductor memory device 10 includes status information STS, and read data DAT.

The buffer memory 25 temporarily retains data or the like that the controller 20 receives from the semiconductor memory device 10 and the host device.

The host interface circuit 26 is connected to a host device through a host bus (not illustrated) and communicates with the host device. For example, the host interface circuit 26 transfers the instruction and data received from the host device to the processor 21 and the buffer memory 25, respectively.

1-1-2. Configuration of Semiconductor Memory Device 10

Figure 2:
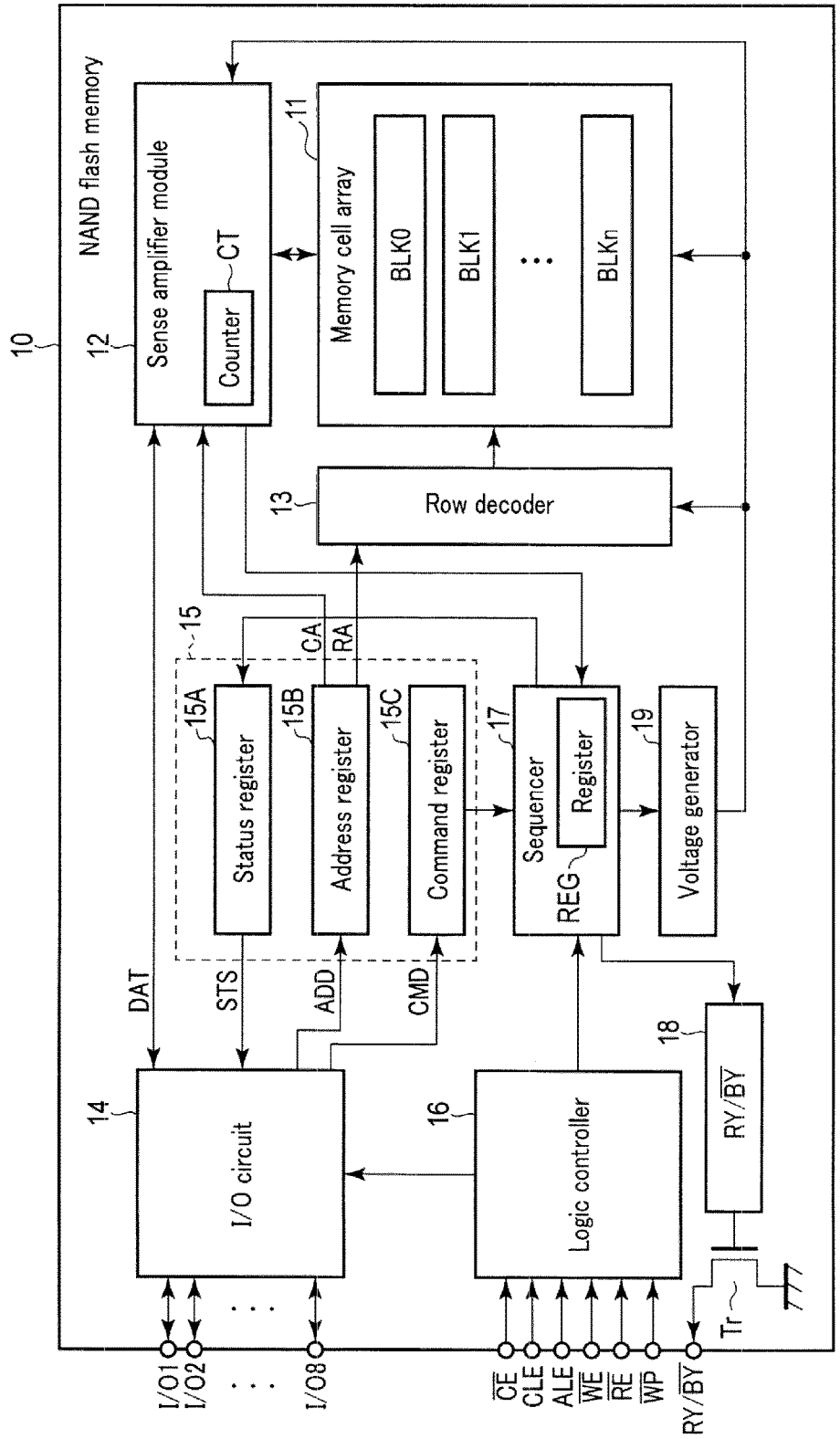
FIG. 2 is a block diagram of a semiconductor memory device according to the first embodiment.

Next, the configuration of the semiconductor memory device 10 will be described with reference to FIG. 2. FIG. 2 illustrates a block diagram of the semiconductor memory device 10. As illustrated in FIG. 2, the semiconductor memory device 10 includes a memory cell array 11, a sense amplifier module 12, a row decoder 13, an input/output circuit 14, a register 15, a logic controller 16, a sequencer 17, a ready/busy control circuit 18, and a voltage generator 19.

The memory cell array 11 includes blocks BLK0 to BLKn (n is a natural number equal to or greater than 1). The block BLK is a set of a plurality of nonvolatile memory cells associated with a bit line and a word line, and is, for example, an erase unit for data. Each memory cell can store data of a plurality of bits, by applying a multi-level cell (MLC) method.

The sense amplifier module 12 outputs the data DAT read from the memory cell array 11 to the controller 20 through the input/output circuit 14. The sense amplifier module 12 transfers the write data DAT received from the controller 20 through the input/output circuit 14 to the memory cell array 11.

The sense amplifier module 12 also includes a counter CT, and a plurality of sense amplifier unit (not illustrated) provided for each bit line. The counter CT counts the number of on-cells of the read data and transfers the count result to the sequencer 17. Details of the sense amplifier unit will be described later.

The row decoder 13 selects the word line corresponding to the memory cell to be subjected to the read operation and the write operation. Then, the row decoder 13 applies desired voltages to the selected word line and the unselected word line, respectively.

The input/output circuit 14 transmits and receives input and output signals I/O (I/O1 to I/O8) having, for example, an 8 bit width to and from the controller 20. For example, the input/output circuit 14 transfers the write data DAT included in the input/output signal I/O received from the controller 20, to the sense amplifier module 12. Further, the input/output circuit 14 transmits the read data DAT transferred from the sense amplifier module 12, to the controller 20 as an input/output signal I/O.

The register 15 includes a status register 15A, an address register 15B, and a command register 15C. The status register 15A retains status information STS. The status register 15A transfers the status information STS to the input/output circuit 14, in response to the instruction from the sequencer 17. The address register 15B receives address information ADD from the input/output circuit 14 and retains the address information ADD. The address register 15B transfers a column address signal CA and a row address signal RA, included in the address information ADD, to the sense amplifier module 12 and the row decoder 13, respectively. The command register 15C receives a command CMD from the input/output circuit 14, and retains the command CMD. The command register 15C transfers the command CMD to the sequencer 17.

The logic controller 16 receives various control signals from the controller 20, and controls the input/output circuit 14 and the sequencer 17. As the control signal, for example, a chip enable signal /CE, a command latch enable signal CLE, an address latch enable signal ALE, a write enable signal /WE, a read enable signal /RE, and a write protect signal /WP are used. The signal /CE is used to enable the semiconductor memory device 10. The signal CLE is used to notify the input/output circuit 14 that the signal input to the semiconductor memory device 10 in parallel with the asserted signal CLE is the command CMD. The signal ALE is used to notify the input/output circuit 14 that the signal input to the semiconductor memory device 10 in parallel with the asserted signal ALE is the address information ADD. The signals /WE and /RE are used to instruct the input/output circuit 14 to input and output, for example, input/output signals I/O1 to I/O8, respectively. The signal /WP is used to protect the semiconductor memory device 10, for example, when the power supply is turned on and off.

The sequencer 17 controls the operation of the entire semiconductor memory device 10. Specifically, the sequencer 17 controls the sense amplifier module 12, the row decoder 13, the voltage generator 19 and the like based on the command CMD transferred from the command register 15C, and executes a write operation, a read operation, and the like of data. Furthermore, the sequencer 17 can calculate a correction value of the optimum read voltage, based on the results of a plurality of read operations using different read voltages. The details of the operation will be described later.

Further, the sequencer 17 includes a register REG. The register REG retains, for example, a parameter associated with the voltage applied to the word line during a read operation, and the sequencer 17 executes the read operation with reference to this parameter. Each parameter retained in the register REG can be rewritten.

The ready/busy control circuit 18 generates a RY/(BY) based on the operation state of the sequencer 17, and transmits this signal to the controller 20. The signal RY/(BY) is a signal for notifying the controller 20 whether the semiconductor memory device 10 is in a ready state or a busy state. In the ready state, an instruction from the controller 20 is accepted, and in the busy state, an instruction from the controller 20 is not accepted. The signal RY/(/BY) is generated by the ready/busy control circuit 18 controlling on/off of the transistor Tr connected to the output thereof. For example, the signal RY/(/BY), the semiconductor memory device 10 is set to "L" level (busy state) during the operation such as reading of data by the semiconductor memory device 10, and is set to "H" level when these operations are completed (ready state).

The voltage generator 19 generates a desired voltage based on the instruction from the sequencer 17. The voltage generator 19 supplies the generated voltage to the memory cell array 11, the sense amplifier module 12, and the row decoder 13.

1-1-3. Configuration of Memory Cell Array 11

Figure 3:
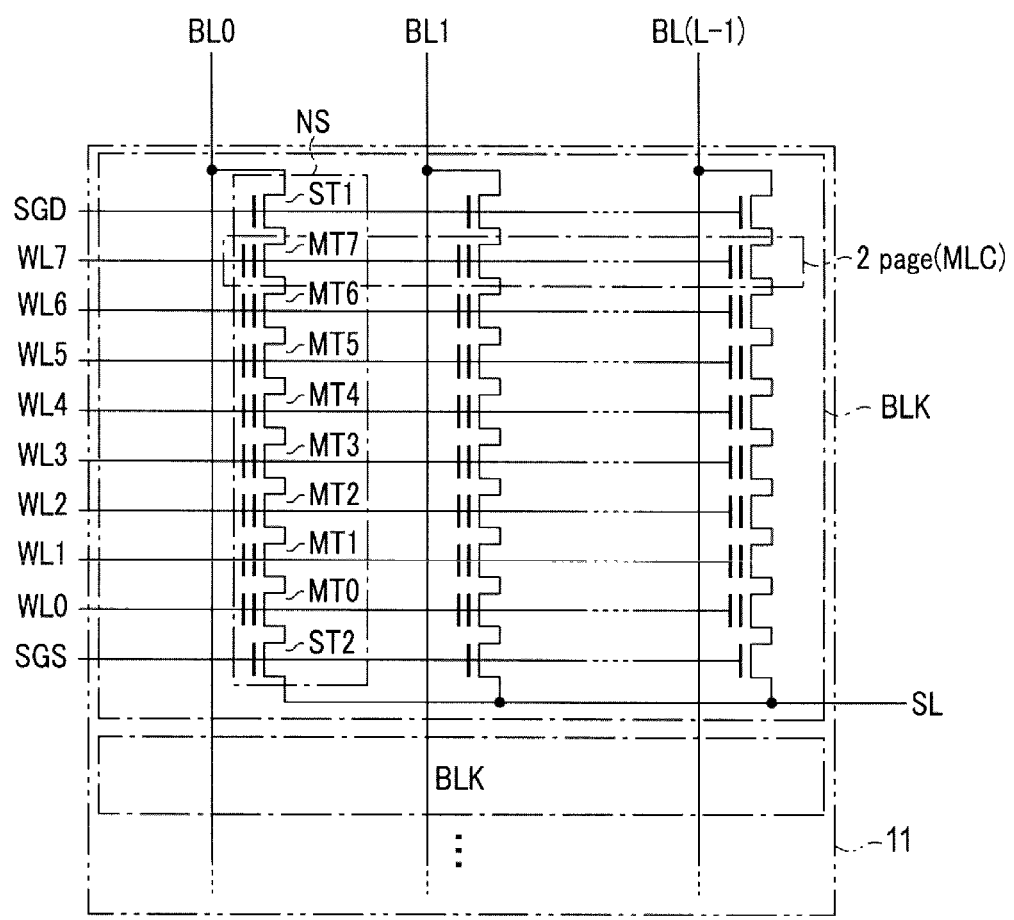
FIG. 3 is a circuit diagram of a memory cell array including the semiconductor memory device according to the first embodiment.

Next, the configuration of the memory cell array 11 will be described with reference to FIG. 3. FIG. 3 is a circuit diagram of the memory cell array 11, and illustrates a detailed circuit configuration of one block BLK in the memory cell array 11. As illustrated in FIG. 3, the block BLK includes a plurality of NAND strings NS.

Each NAND string NS corresponds to one of bit lines BL0 to BL(L-1) ((L-1) is a natural number equal to or larger than 1), and includes, for example, eight memory cell transistors MT (MT0 to MT7) and select transistors ST1 and ST2. Any other number of memory cell transistors MT may be included in one NAND string NS.

The memory cell transistor MT includes a control gate and a charge storage layer, and retains data in a nonvolatile state. In addition, the memory cell transistors MT0 to MT7 are connected in series between the source of the select transistor ST1 and the drain of the select transistor ST2. The gates of the select transistor ST1 and ST2 in the same block BLK are commonly connected to select gate lines SGD and SGS, respectively. Similarly, the control gates of the memory cell transistors MT0 to MT7 in the same block BLK are commonly connected to word lines WL0 to WL7, respectively.

In the memory cell array 11, the drain of the select transistor ST1 in any NAND string NS in the same column is commonly connected to the bit line BL. That is, the bit line BL commonly connects the NAND strings NS in the same column in a plurality of blocks BLK. Further, the sources of the plurality of select transistors ST2 are commonly connected to a source line SL.

In the above configuration, a set of one-bit data pieces stored in a plurality of memory cells connected to a common word line WL is called "page". Therefore, when two-bit data is stored in one memory cell, data of two pages is stored in a set of the plurality of memory cells connected to one word line WL.

"Page" includes data area and a redundant area. An external electronic equipment sends data to be stored in the data area of the semiconductor memory device 10. In the redundant area, for example, data such as metadata concerning the data area is written.

Figure 4:
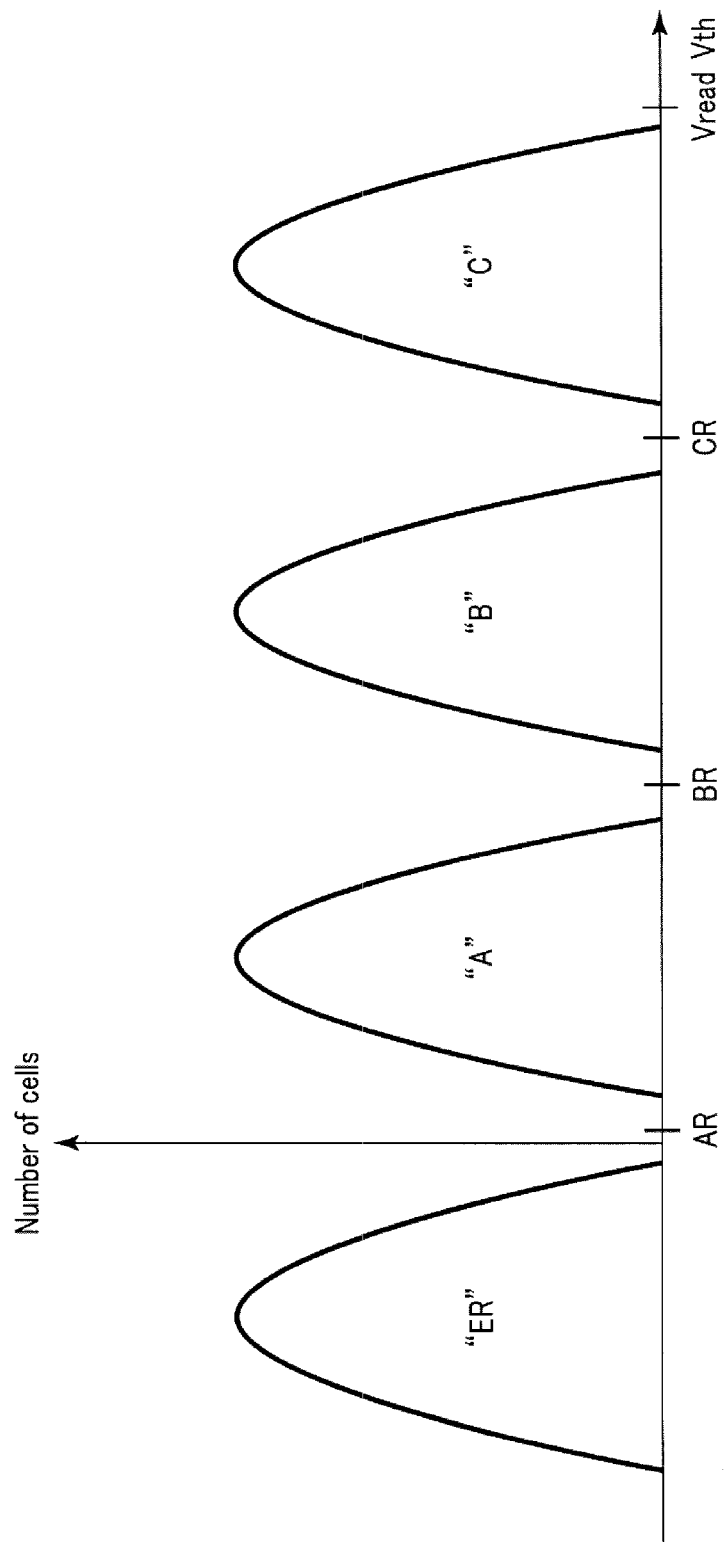
FIG. 4 is a threshold voltage distribution of a memory cell including the semiconductor memory device according to the first embodiment.

Incidentally, the threshold voltage distribution of the memory cell transistor MT described above is, for example, as illustrated in FIG. 4. FIG. 4 illustrates the threshold voltage distribution of the memory cell transistor MT retaining two-bit data and the voltage used during the read operation. The vertical axis and the horizontal axis in FIG. 4 correspond to the number of memory cell transistors MT and the threshold voltage Vth, respectively.

When the memory cell transistor MT retains two-bit data, the threshold voltage distribution thereof is divided into four distributions as illustrated in FIG. 4. The two-bit data correlated with each of these four threshold voltage distributions is called "ER" level, "A" level, "B" level, and "C" level in an ascending order of the threshold voltage. The memory cell transistor MT retaining "ER" level corresponds to a data erase state, and the memory cell transistor retaining "A" level, "B" level, or "C" level corresponds to a data write state. During a read operation, a level of the threshold voltage of the memory cell transistor MT to be read is determined. For this determination, various read voltages are set.

A read voltage AR for determining whether a certain memory cell transistor MT has a threshold voltage of "ER" level or a threshold voltage equal to or higher than "A" level is set to a range between the higher side of "ER" level and the lower side of "A" level. A read voltage BR for determining whether a certain memory cell transistor MT has a threshold voltage equal to or lower than "A" level or a threshold voltage equal to or higher than "B" level is set to a range between the higher side of "A" level and the lower side of "B" level. A read voltage CR for determining whether a certain memory cell transistor MT has a threshold voltage equal to or lower than "B" level or a threshold voltage of "C" level is set to a range between the higher side of "B" level and the lower side of "C" level. The read voltage Vread illustrated in FIG. 4 is applied to the gate of the memory cell transistor MT and set to a voltage at which the memory cell transistor MT is turned on, regardless of the data that is retained in the memory cell transistor MT. The relationship is established AR<BR<CR<Vread among these voltage values.

1-1-4. Configuration of Sense Amplifier Module 12

Figure 5:
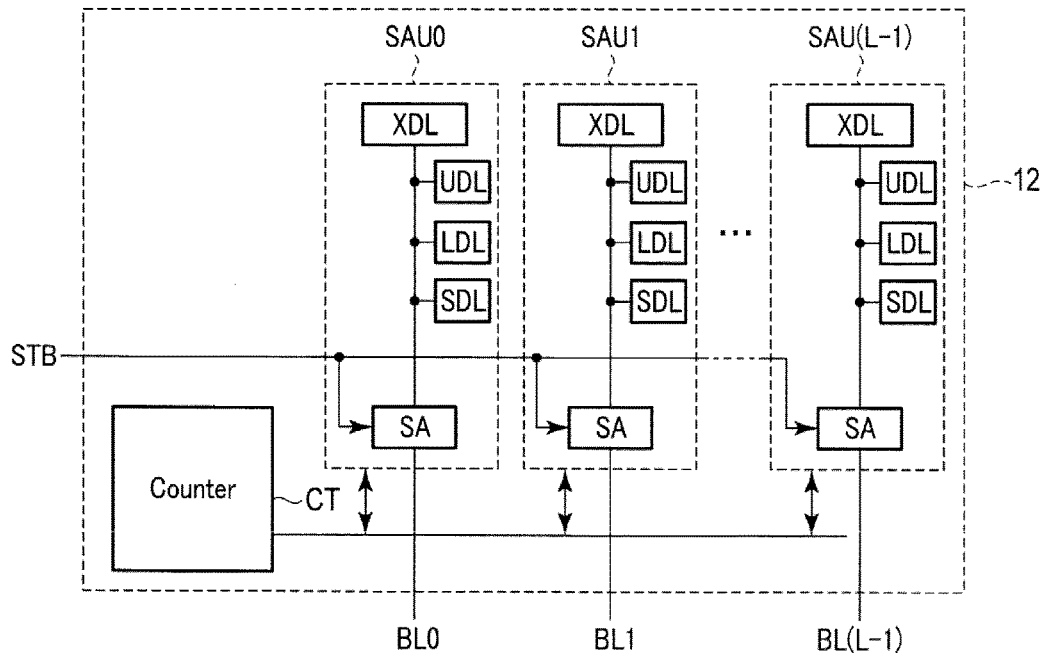
FIG. 5 is a circuit diagram of a sense amplifier module including the semiconductor memory device according to the first embodiment.

Next, the configuration of the sense amplifier module 12 will be described with reference to FIG. 5. FIG. 5 is a circuit diagram of the sense amplifier module 12. As illustrated in FIG. 5, the sense amplifier module 12 includes sense amplifier units SAUs (SAU0 to SAU(L−1)) provided for respective bit lines BL.

Each sense amplifier unit SAU is connected to the counter CT so as to be able to transmit and receive data. Each sense amplifier unit SAU includes a sense amplifier SA, and latch circuits SDL, LDL, UDL, and XDL. The sense amplifier SA, and the latch circuits SDL, LDL, UDL, and XDL are connected so as to be able to transmit and receive data to and from each other.

During a read operation, the sense amplifier SA senses the data read at the corresponding bit line BL and determines whether the read data is "0" or "1". Specifically, for example, the sense amplifier unit SAU fixes the read data at a timing when the control signal STB generated by the sequencer 17 is asserted. During a write operation, a voltage is applied to the bit line BL based on the write data.

The latch circuits SDL, LDL, and UDL temporarily retain read data and write data. The read data fixed by the sense amplifier SA during the read operation, and the write data transferred to the latch circuit XDL during writing are transferred to, for example, any one of the latch circuits SDL, LDL, and UDL.

The latch circuit XDL is used for inputting/outputting data between the sense amplifier unit SAU and the controller 20. That is, the data received from the controller 20 is transferred to the latch circuit SDL, LDL, or UDL or the sense amplifier SA through the latch circuit XDL. The data of the latch circuit SDL, LDL, or UDL or the sense amplifier SA is transferred to the controller 20 through the latch circuit XDL.

Incidentally, any other configurations of the sense amplifier module 12 are possible, and various modifications can be made. For example, the number of latch circuits included in the sense amplifier unit SAU is designed, based on the number of bits of data retained in one memory cell transistor MT.

1-2. Operation

In the following, the operation of the memory system 1 will be described.

1-2-1. Operation of Semiconductor Memory Device 10

First, prior to explaining the operation of the entire memory system 1, a plurality of operations that can be executed by the semiconductor memory device 10 will be described below.

The semiconductor memory device 10 can execute a normal read, a tracking read, and a shift read. In the read operation of memory system 1, data is read out by selecting one or more of these operations.

The normal read is a normal read sequence for reading data by using a preset read voltage. The tracking read is a read sequence for determining an optimum read voltage. The shift read is a read sequence using a correction value associated with the optimum read voltage.

Figure 6:
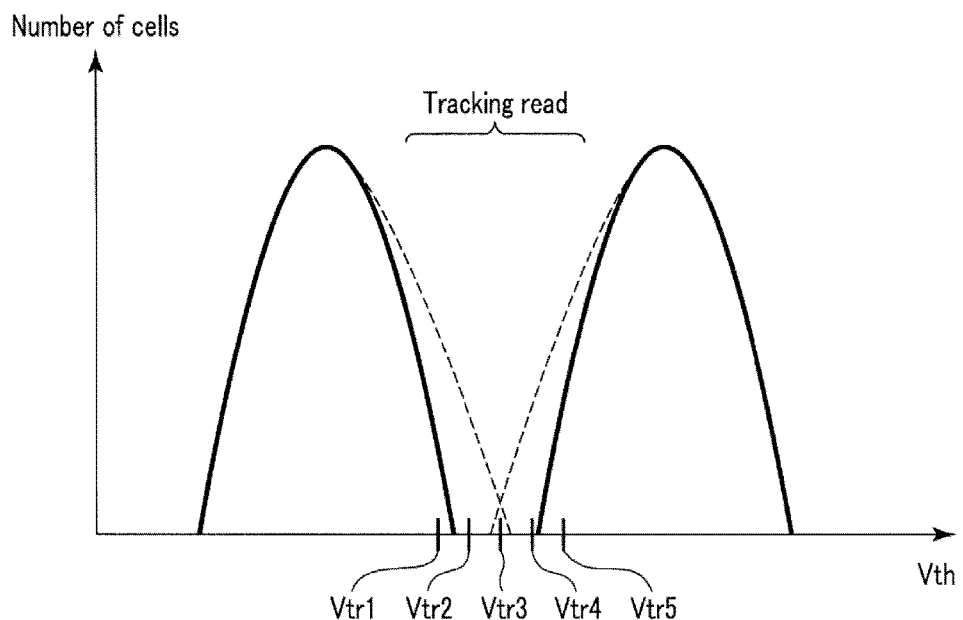
FIG. 6 is an explanatory diagram of a tracking read operation of the semiconductor memory device according to the first embodiment.
Figure 7:
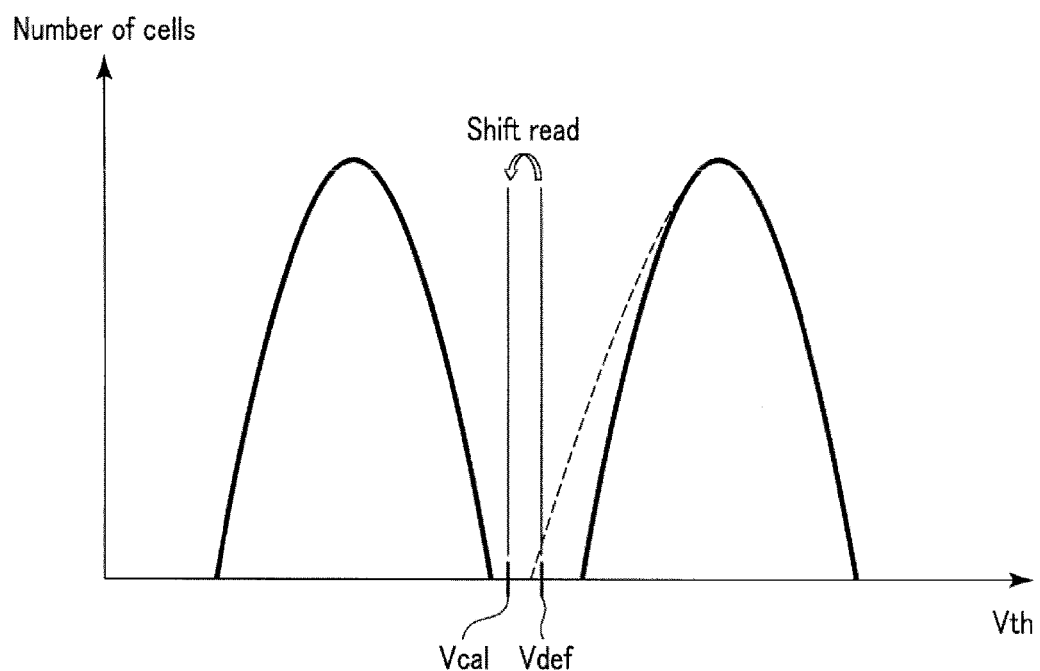
FIG. 7 is an explanatory diagram of a shift read operation of the semiconductor memory device according to the first embodiment.

In the following, the details of the tracking read and the shift read will be described below with reference to FIG. 6 and FIG. 7. FIG. 6 and FIG. 7 illustrate threshold voltage distributions of two adjacent levels, and respectively illustrate examples of the read voltages used for tracking read and shift read.

The memory cell transistor MT is influenced by program disturbance and factors affecting data retention after the write operation, read disturbance after the read operation, and the like. The threshold voltage distribution of the memory cell is increased by the influence of program disturbance and read disturbance due to various voltages applied to the memory cell, and is lowered by the factors affecting data retention such that electric charge is drained from the memory cell. When receiving such influence, the threshold voltage distribution of the memory cell transistor MT may spread as indicated, for example, by a broken line in FIG. 6. In the normal read, data may not be correctly read out from the memory cell transistor MT that has the threshold voltage distribution spread in this way.

In the tracking read, in order to calculate the correction value of the read voltage, for example, read operations using five types of read voltages (Vtr1 to Vtr5) as illustrated in FIG. 6 are executed. The voltage values of the voltages Vtr1 to Vtr5 are different from each other and the range of the voltage values is set to include the valley of the adjacent threshold voltage distribution. The sequencer 17 calculates the correction value of the read voltage based on the read results of the voltages Vtr1 to Vtr5.

Specifically, the counter CT counts the number of on-cells and transfers this count information to the sequencer 17, at each read operation in the tracking read. The sequencer 17 calculates the amount of change in each number of on-cells. For example, the sequencer 17 calculates a difference between the number of on-cells in the case of reading with the voltage Vtr1 and the number of on-cells in the case of reading with the voltage Vtr2. Similarly, a difference between the number of on-cells in the case of reading with the voltages Vtr2 and Vtr3, a difference between the number of on-cells in the case of reading with the voltages Vtr3 and Vtr4, and a difference between the number of on-cells in the case of reading with the voltages Vtr4 and Vtr5 are calculated. The sequencer 17 calculates the correction value of the read voltage based on the read results.

More specifically, a predetermined reference value is provided for the amount of change in the number of on-cells, and the sequencer 17 determines as "fail" when the amount of change in the number of on-cells exceeds the reference value, and determines as "pass" when the change amount is equal to or less than the reference value. In this way, it is possible to know what shape the threshold voltage distribution of the memory cell roughly has, by determining the amount of change in the number of on-cells with a certain threshold voltage value.

For example, when the amount of change in the number of on-cells is "pass" in a range between the voltages Vtr1 and Vtr2, and a range between the voltages Vtr2 and Vtr3, and is "fail" in a range between the voltages Vtr3 and Vtr4, and a range between the voltages Vtr4 and Vtr5, the valley of the threshold voltage distribution of the page is located in a range between the voltages Vtr1 and Vtr3 in which the amount of change in the number of on-cells is small. For example, the voltage Vtr2 is selected as an optimum read voltage in this case. The correction value corresponding to the calculated optimum read voltage is retained in the register REG for each read level.

The correction value of the read voltage which is calculated in this manner is applied to, for example, the shift read for the corresponding page. Specifically, for example, when the bottom of the higher side of the threshold voltage distribution spreads as indicated by the dashed line in FIG. 7, the optimum read voltage Vcal corrected from the initial set read voltage Vdef to the lower read voltage is used for the read voltage of the shift read. This voltage Vcal is included in the read voltage used for tracking read. That is, in the case of this embodiment, the voltage Vcal is any one of the voltages Vtr1 to Vtr5.

As described above, the semiconductor memory device 10 according to the present embodiment can calculate the correction value of the read voltage without passing through the controller 20 and execute a shift read using the correction value, when executing the tracking read.

Any other number of tracking reads of the semiconductor memory device 10 may be executed. For example, the semiconductor memory device 10 may perform tracking read using six or more types of read voltages.

1-2-2. Read Operation of Memory System 1 the read operation of the memory system 1 will now be described. In the read operation of the memory system 1, the semiconductor memory device 10 can execute the first to third read operations in response to the first to third command sets issued by the controller 20, respectively.

The first read operation includes the tracking read and the shift read. Specifically, the semiconductor memory device 10 first executes the tracking read and then executes the shift read of the same page by using the correction value of the read voltage obtained by the tracking read. The second read operation is a shift read using the correction value of the read voltage obtained by the most recent tracking read. The third read operation is a normal read.

Figure 8:
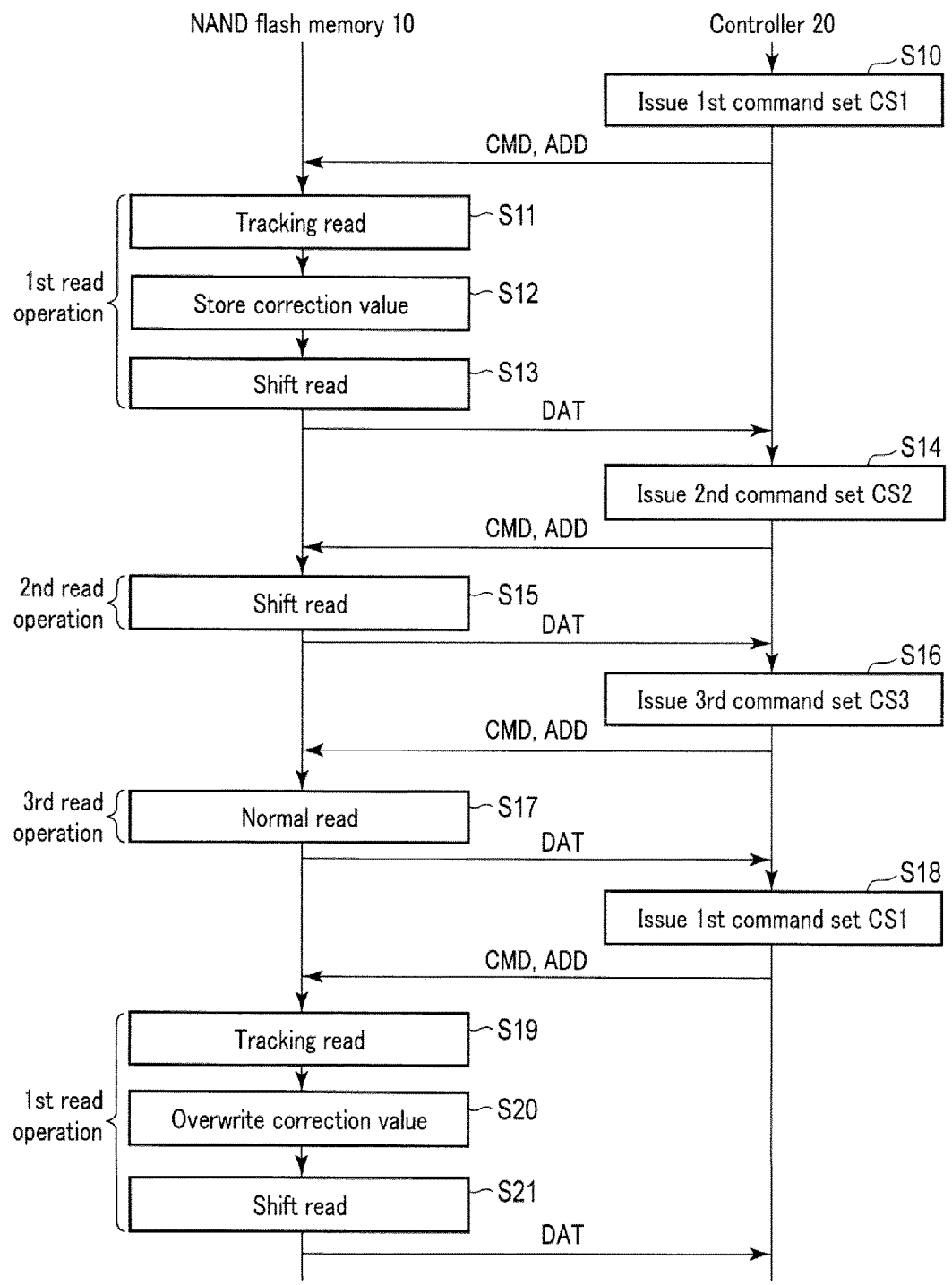
FIG. 8 is a flowchart of the read operation of the memory system according to the first embodiment.
Figure 9:
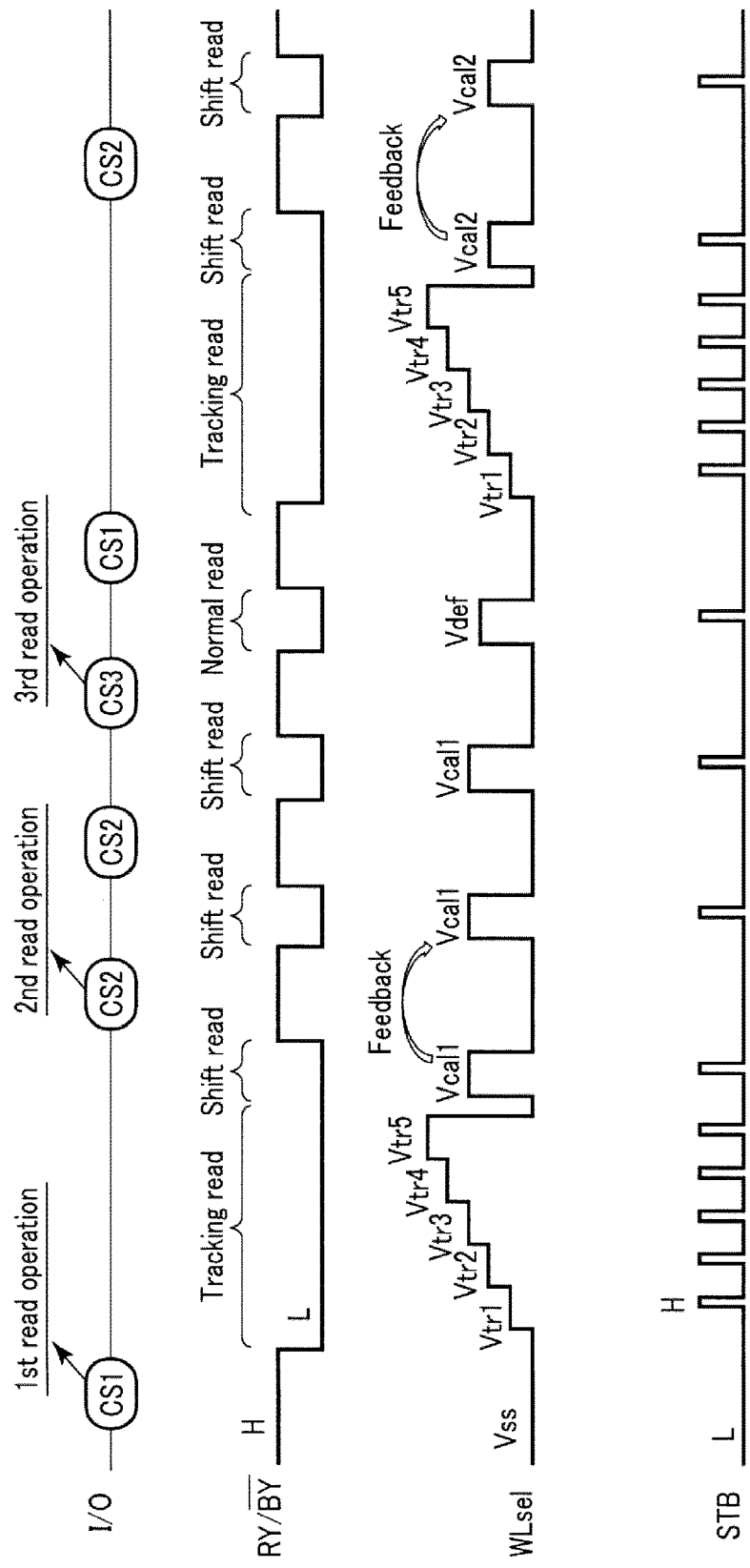
FIG. 9 is a waveform diagram of the read operation of the memory system according to the first embodiment.

In the following, the specific example of the read operation of the memory system 1 will be described with reference to FIG. 8 and FIG. 9. FIG. 8 and FIG. 9 respectively illustrate the example of the read operation as a flowchart and a timing chart. The WLsel illustrated in FIG. 9 indicates a voltage applied to a word line WL correlated with a page from which data is to be read (hereinafter, referred to as a selected word line). In other words, the word line correlated with a selected word line WLsel illustrated in FIG. 9 changes appropriately as the operation progresses.

Figure 10:
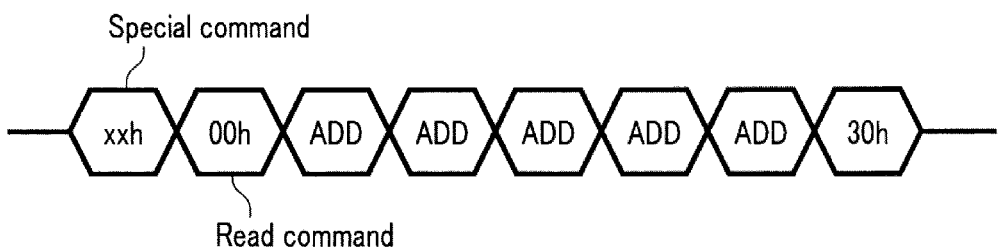
FIG. 10 is a command sequence of the tracking read operation of the memory system according to the first embodiment.

As illustrated in FIG. 8, first, the controller 20 issues a first command set CS1 (step S10), and sends the first command set CS1 to the semiconductor memory device 10. The first command set CS1 is a command sequence as illustrated in FIG. 10.

Specifically, first, the controller 20 issues a special command "xxh" and a read command "00h" continuously, and sends the commands "xxh" and "00h" to the semiconductor memory device 10. The command "xxh" is a command to instruct the semiconductor memory device 10 to perform tracking read and shift read. The command "00h" corresponds to an address input reception command for reading, and is a command to instruct the semiconductor memory device 10 to perform a read operation of data.

Next, the controller 20 issues address information ADD, for example, for five cycles, and sends the address information ADD to the semiconductor memory device 10. This address information ADD is used to designate the address to be read. Subsequently, the controller 20 issues the command "30h" and sends the command "30h" to the semiconductor memory device 10. Command "30h" is a command for causing the semiconductor memory device 10 to read data, based on the command CMD and the address information ADD which are sent immediately before.

If the semiconductor memory device 10 receives such a command set CS1 (command CMD and address information ADD), the input/output circuit 14 of the semiconductor memory device 10 transfers the received command and address information, and write data to the command register 15C and the address register 15B, respectively. If the command "30h" is stored in the command register 15C, the ready/busy signal is changed from "H" level to "L" level, and the sequencer 17 first executes the tracking read for the designated page (step S11).

Specifically, for example, as illustrated in FIG. 9, the row decoder 13 sequentially applies the read voltages Vtr1 to Vtr5 to the selected word line WLsel. When the sequencer 17 asserts a signal STB while each read voltage is applied to the selected word line WLsel, data is read by the sense amplifier module 12, respectively. As described above, the number of on-cells of the read data is counted by the counter CT, and the sequencer 17 calculates the correction value of the read voltage based on this information on the number of on-cells.

Next, the sequencer 17 retains the correction value of the read voltage calculated by the tracking read, in the register REG in the sequencer 17 (step S12). Subsequently, the sequencer 17 executes shift read on the page on which the tracking read is executed in step S11, by using the correction value retained in the register REG (step S13).

Specifically, for example, as illustrated in FIG. 9, the row decoder 13 applies the read voltage Vcal1 to the selected word line WLsel. The voltage Vcal1 is a read voltage to which the correction value calculated by the tracking read executed immediately before is applied. When the sequencer 17 asserts the signal STB while the voltage Vcal1 is applied to the selected word line WLsel, data is read by the sense amplifier module 12.

The operations of steps S11 to S13 described above corresponds to a first read operation. If the data DAT read by the shift read in step S13 is sent to the controller 20, the ready/busy signal changes from "L" level to "H" level.

Figure 11:
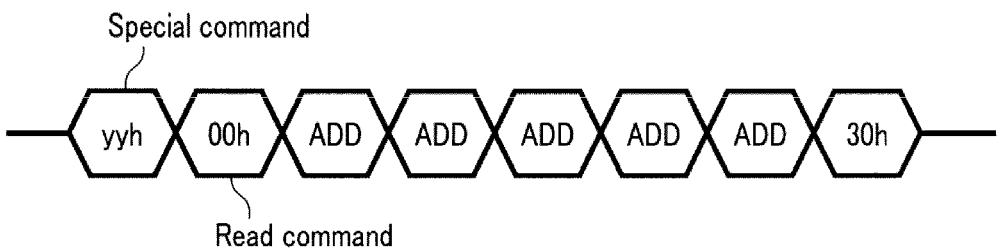
FIG. 11 is a command sequence of the shift read operation of the memory system according to the first embodiment.

Next, the controller 20 issues a second command set CS2 (step S14), and sends the second command set CS2 to the semiconductor memory device 10. The second command set CS2 is a command sequence as illustrated in FIG. 11.

Specifically, the command set CS2 is similar to the command set CS1 illustrated in FIG. 10, except that the special command "xxh" is replaced with a special command "yyh". The command "yyh" is a command instructing the semiconductor memory device 10 to execute the shift read using the correction value of the read voltage obtained by the most recent tracking read.

If the semiconductor memory device 10 receives such a command set CS2 (command CMD and address information ADD), the input/output circuit 14 of the semiconductor memory device 10 transfers the received command and address information, and write data to the command register 15C and the address register 15B, respectively. If the command "30h" is stored in the command register 15C, the ready/busy signal is changed from "H" level to "L" level, and the sequencer 17 executes the shift read, during which the correction value calculated by the most recent tracking read is applied, on a page to be read next (step S15).

Specifically, for example, as illustrated in FIG. 9, the row decoder 13 applies the read voltage Vcal1 with the correction value obtained in step S11, to the selected word line WLsel different from the word line on which the tracking read is executed in step S11. When the sequencer 17 asserts the signal STB while the voltage Vcal1 is applied to the selected word line WLsel, data is read by the sense amplifier module 12.

The operation of step S15 described above corresponds to a second read operation. As described above, in the second read operation, a shift read using the correction value of the read voltage calculated by the most recent tracking read is executed, without executing the tracking read. If the data DAT read by the shift read in step S15 is sent to the controller 20, the ready/busy signal changes from "L" level to "H" level. In the example illustrated in FIG. 9, the second read operation by the command set CS2 is executed twice in succession.

Figure 12:
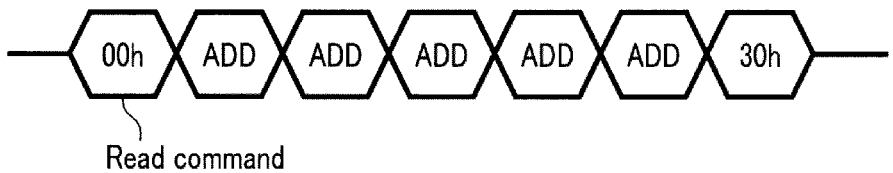
FIG. 12 is a command sequence of a normal read operation of the memory system according to the first embodiment.

Next, the controller 20 issues a third command set CS3 (step S16), and sends the third command set CS3 to the semiconductor memory device 10. The third command set CS3 is a command sequence as illustrated in FIG. 12.

Specifically, the command set CS3 is similar to the command set CS1 illustrated in FIG. 10, except that the special command "xxh" is not issued.

If the semiconductor memory device 10 receives such a command set CS3 (command CMD and address information ADD), the input/output circuit 14 of the semiconductor memory device 10 transfers the received command and address information, to the command register 15C and the address register 15B, respectively. If the command "30h" is stored in the command register 15C, the ready/busy signal is changed from "H" level to "L" level, and the sequencer 17 executes the normal read on the next read page (step S17).

Specifically, for example, as illustrated in FIG. 9, the row decoder 13 applies the read voltage Vdef to the selected word line WLsel. When the sequencer 17 asserts the signal STB while the voltage Vdef is applied to the selected word line WLsel, data is read by the sense amplifier module 12.

The operation of step S17 described above corresponds to a third read operation. If the data DAT read by the normal read in step S17 is sent to the controller 20, the ready/busy signal changes from "L" level to "H" level.

Next, the controller 20 issues a command set CS1 (step S19), and sends the command set CS1 to the semiconductor memory device 10. Thus, the semiconductor memory device 10 that receives the command set CS1 executes the first read operation similar to steps S11 to S13.

Specifically, the tracking read is first executed on the page designated by the sequencer 17 (step S19). Next, the sequencer 17 overwrites the correction value of the read voltage calculated by the tracking read in step S19 in the register REG (step S20). Subsequently, the sequencer 17 applies the overwritten correction value to the register REG, and performs the shift read on the page on which the tracking read is executed in step S19 (step S21).

In the example illustrated in FIG. 9, the read voltage Vcal2 is applied to the selected word line WLsel, in the shift read of the second time of the first read operation. The voltage Vcal2 is a read voltage with the correction value obtained in step S19. Then, in the second read operation by the subsequent command set CS2, the shift read using voltage Vcal2 is executed.

As described above, the semiconductor memory device 10 according to the present embodiment applies the correction value of the read voltage obtained by the tracking read to the shift read for other pages on which the tracking read is not performed. This correction value is updated each time the tracking read is executed.

In the above description, the read voltages Vcal1 and Vcal2 that have the correction value obtained by the tracking read are each equal to one of the voltages Vtr1 to Vtr5. In addition, the voltage Vcal1 and the voltage Vcal2 may be different from each other or may the same as each other.

In the above description, the read operation of the memory system 1 includes the third read operation, but any other read operations can be included. For example, the third read operation may not be executed in the read operation. In such a case, the read operation is executed using two types of command sets (CS1 and CS2).

1-3. Effect of First Embodiment

Next, the effect of the first embodiment will be described. By the memory system 1 according to the present embodiment, it is possible to speedup the operation. This effect will be described in detail below.

In the semiconductor memory device, the threshold voltage distribution of the memory cell spreads or shifts from the position where the threshold voltage distribution should originally be, due to read disturbance by the read operation after writing data, data retention problems caused by time lapse, or the like. Thus, the number of error bits of the data read from the memory cell becomes large, and data may not be correctly read in some cases.

For such a memory cell, a shift read using the corrected read voltage is executed. Thus, the semiconductor memory device can reduce the number of error bits of data read from the memory cell, so that data can be read correctly. The correction value of the read voltage applied to the shift read is calculated, for example, by the tracking read for the page from which data is to be read.

However, the tracking read includes a plurality of read operations, and the processing time is long. The tracking read is executed as a re-read operation, for example, for the page where error correction by ECC becomes impossible due to an increase in the number of error bits. Therefore, in the semiconductor memory device, if the number of degraded memory cells increases, the number of occurrences of the tracking read increases, and there is a possibility that the operation is delayed.

In order to reduce the number of tracking reads, it may be effective to execute a shift read by predicting an appropriate read voltage beforehand. Moreover, if the conditions under which the memory cell receives read disturbance and the factors affecting data retention are the same, it can be inferred that the result from the tracking read becomes almost the same.

Therefore, the memory system 1 according to the present embodiment retains the correction value of the read voltage calculated by the tracking read in the semiconductor memory device 10. Then, the semiconductor memory device 10 applies this correction value in the shift read of pages for which tracking read is not performed.

Specifically, the memory system 1 selectively uses a first read operation of executing a tracking read and a shift read using the correction value of the read voltage calculated by this tracking read, and a second read operation of executing a shift read using the correction value of the read voltage calculated by the most recent first read operation, according to the command set issued by the controller 20.

More specifically, at the beginning of the read operation, the controller 20 issues a command set CS1 instructing the first read operation, and when reading the subsequent page data, the controller 20 issues the command set CS2 instructing the second read operation. The command sets CS1 and CS2 include special commands as illustrated in FIG. 10 and FIG. 11.

In this way, the number of error bits can be reduced, as compared with the case of reading the data by using the preset read voltage, by executing a shift read using the correction value obtained by the most recent tracking read, on the page on which the tracking read is not performed. Further, the controller 20 issues the command set CS1 at any timing and updates the correction value of the read voltage, so that it is possible to use the more appropriate correction value of the read voltage.

For example, the influence of disturbance received by data written to the same block BLK may be almost the same. In this case, the controller 20 instructs the first read operation for the page on which data is read first in each block BLK. Then, the controller 20 instructs the second read operation when reading the data of the remaining page in the corresponding block. That is, in this embodiment, the correction value of the read voltage which has been calculated one time for each block BLK is continuously used for that same block BLK.

As described above, the memory system 1 according to the present embodiment can reduce the number of error bits in the read operation, so that it is possible to reduce the frequency of execution of the re-read operation by the tracking read when the memory cell is degraded. Thus, according to the memory system 1 of the present embodiment, it is possible to speed up the operation.

In the read operation of the memory system 1 according to the present embodiment, since the number of tracking reads is reduced as described above, the influence of read disturbance on memory cells is reduced. That is, in the memory system 1 according to the present embodiment, it is possible to reduce the change in the threshold voltage distribution of the memory cell due to the read disturbance, so that the reliability of the written data can be improved.

2. Second Embodiment

Next, a memory system 1 according to a second embodiment will be described. The second embodiment is described as an example in which the controller 20 executes a shift read using the correction value obtained by the most recent tracking read, without issuing a special command, in the read operation described in the first embodiment above. In the following, a difference from the first embodiment will be described.

2-1. Read Operation of Memory System 1

First, the read operation of the memory system 1 will be described. Whereas the semiconductor memory device 10 according to the first embodiment executes the second read operation in response to the second command set CS2, the semiconductor memory device 10 according to the present embodiment is used to execute the second read operation in response to the third command set CS3.

Figure 13:
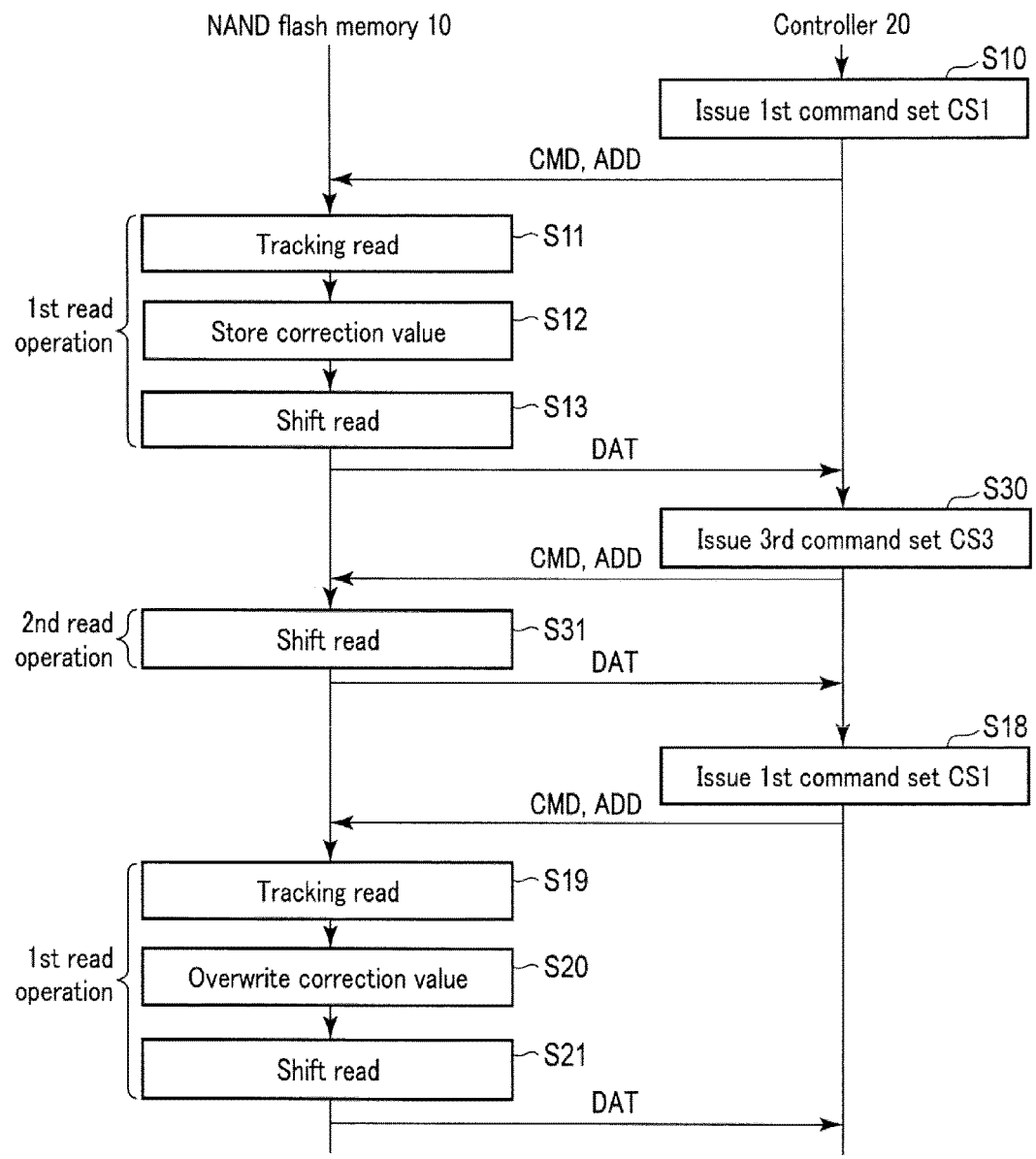
FIG. 13 is a flowchart of a read operation of a memory system according to a second embodiment.
Figure 14:
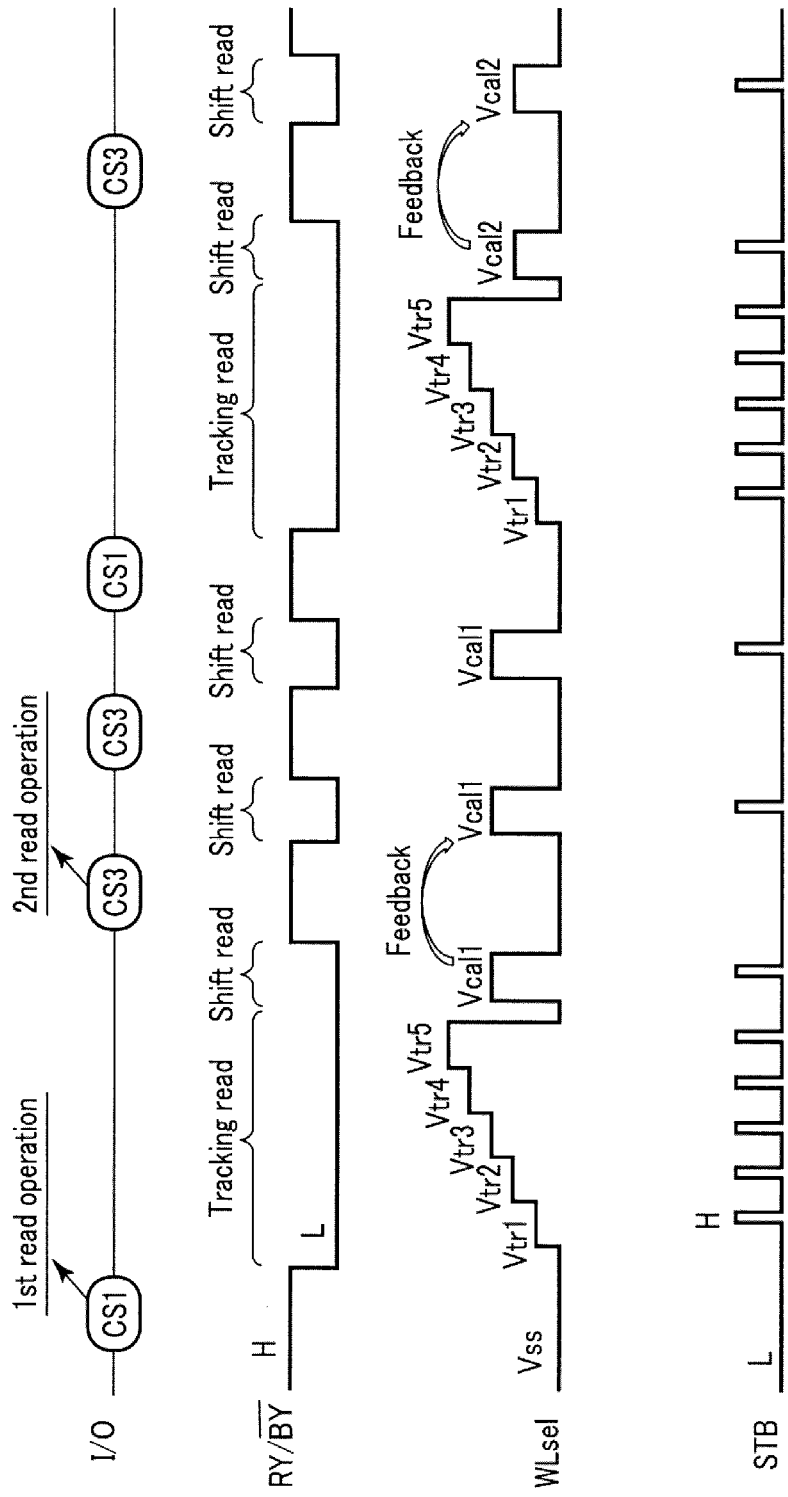
FIG. 14 is a waveform diagram of the read operation of the memory system according to the second embodiment.

In the following, the specific example of the read operation of the memory system 1 will be described with reference to FIG. 13 and FIG. 14. FIG. 13 and FIG. 14 respectively illustrate the example of the read operation as a flowchart and a timing chart. WLsel illustrated in FIG. 14 indicates the voltage applied to the selected word line, and the word line corresponding to the WLsel changes appropriately as the operation progresses.

As illustrated in FIG. 13, first, the controller 20 issues a first command set CS1 (step S10), and sends the first command set CS1 to the semiconductor memory device 10. Since the operations of the semiconductor memory device 10 based on the command set CS1 illustrated in FIG. 13 and FIG. 14 are the same as in the steps S11 to S13 described in the first embodiment, the explanation thereof will be omitted.

Next, the controller 20 issues a third command set CS3 (step S30), and sends the third command set CS3 to the semiconductor memory device 10. If the semiconductor memory device 10 receives such a command set CS3, the input/output circuit 14 of the semiconductor memory device 10 transfers the received command and address information, to the command register 15C and the address register 15B, respectively. If the command "30h" is stored in the command register 15C, the ready/busy signal is changed from "H" level to "L" level, and the sequencer 17 executes the shift read, during which the correction value calculated by the most recent tracking read is applied, on a page to be read next (step S31).

That is, the semiconductor memory device 10 executes the second read operation without receiving a special command such as a command "yyh" contained in the second command set CS2 described in the first embodiment. Since the specific operation in step S31 is the same as in step S15 described in the first embodiment, the explanation thereof will be omitted. In the example illustrated in FIG. 14, the second read operation by the command set CS3 is executed twice in succession.

Next, the controller 20 issues a first command set CS1 (step S18), and sends the first command set CS1 to the semiconductor memory device 10. Since the operations of the semiconductor memory device 10 based on the command set CS1 illustrated in FIG. 13 and FIG. 14 are the same as in the steps S19 to S21 described in the first embodiment, the explanation thereof will be omitted. Then, as illustrated in FIG. 14, in the second read operation by the subsequent command set CS3, the shift read using the correction value of the read voltage calculated by the tracking read in step S19 is executed.

As described above, the semiconductor memory device 10 according to the present embodiment can execute a shift read, during which the correction value of the read voltage obtained by the most recently executed tracking read is applied, in response to the command set CS3 without using the special command.

2-2. Effect of Second Embodiment

Next, the effect of the second embodiment will be described. By the memory system 1 according to the present embodiment, the same effect as in the first embodiment can be achieved, and it is possible to further speed up the operation than in the first embodiment. This effect will be described in detail below.

In the memory system 1 according to the first embodiment, the first read operation including a tracking read and the second read operation which is a shift read using a correction value are executed using command sets CS1 and CS2 including the special command, respectively. On the other hand, in the memory system 1 according to the present embodiment, a command set CS3 which does not include a special command is used for a command set instructing a second read operation.

Thus, in the memory system 1 according to the present embodiment, the command set CS3 which does not include the special command is used to execute the second read operation, so that the command sequence can be shortened by not issuing the special command. That is, by the memory system 1 according to the present embodiment, the same effect as in the first embodiment can be achieved, and it is possible to further speed up the operation than in the first embodiment.

3. Third Embodiment

Next, a memory system 1 according to a third embodiment will be described. The third embodiment is described in which the semiconductor memory device 10 executes a tracking read, when the block address for reading data changes, in the read operation described in the second embodiment. In the following, a difference from the first and second embodiments will be described.

3-1. Read Operation of Memory System 1

First, the read operation of the memory system 1 will be described. In the read operation of the memory system 1 according to the present embodiment, the controller 20 issues a first command set CS1 when reading a first page, and issues a third command set CS3 when reading the subsequent pages. The semiconductor memory device 10 normally executes the second read operation in response to the third command set CS3, and executes the first read operation when the block address included in the received third command set CS3 changes.

Figure 15:
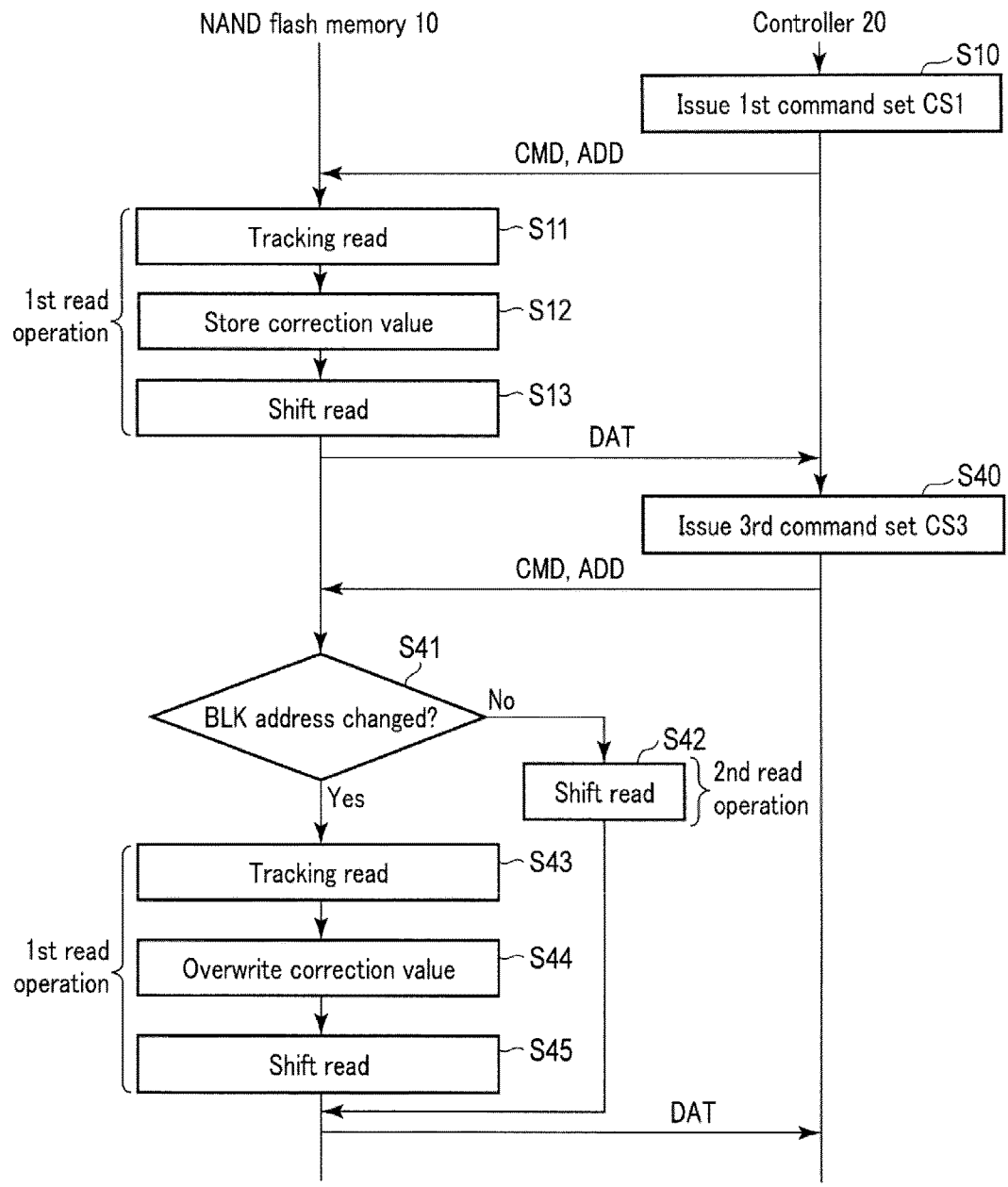
FIG. 15 is a flowchart of a read operation of a memory system according to a third embodiment.
Figure 16:
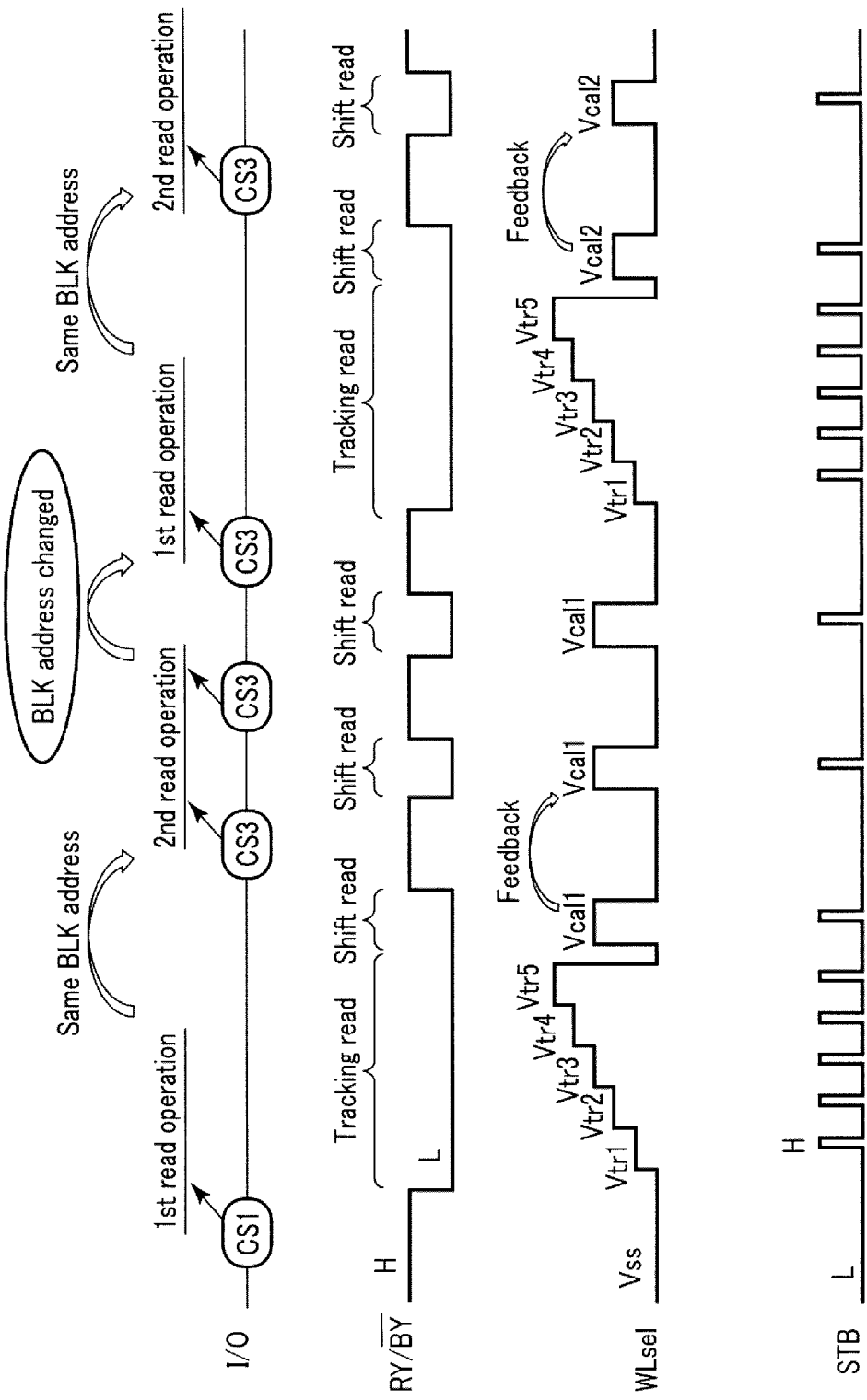
FIG. 16 is a waveform diagram of the read operation of the memory system according to the third embodiment.

In the following, the specific example of the read operation of the memory system 1 will be described with reference to FIG. 15 and FIG. 16. FIG. 15 and FIG. 16 respectively illustrate the example of the read operation as a flowchart and a timing chart. WLsel illustrated in FIG. 16 indicates the voltage applied to the selected word line, and the word line corresponding to the WLsel is changed appropriately as the operation progresses.

As illustrated in FIG. 15, first, the controller 20 issues a first command set CS1 (step S10), and sends the first command set CS1 to the semiconductor memory device 10. Since the operations of the semiconductor memory device 10 based on the command set CS1 illustrated in FIG. 15 and FIG. 16 are the same as in the steps S11 to S13 described in the first embodiment, the explanation thereof will be omitted.

Next, the controller 20 issues a third command set CS3 (step S40), and sends the third command set CS3 to the semiconductor memory device 10. If the semiconductor memory device 10 receives such a command set CS3, the input/output circuit 14 of the semiconductor memory device 10 transfers the received command and address information, to the command register 15C and the address register 15B, respectively. If the command "30h" is stored in the command register 15C, the ready/busy signal is changed from "H" level to "L" level, and the sequencer 17 determines whether or not the designated block address changes from the block address of the page from which data has been read at the previous time (step S41).

If the block address does not change (No in step S41), the sequencer 17 executes the second read operation. That is, the sequencer 17 executes the shift read, during which the correction value calculated by the most recent tracking read is applied (step S42).

In contrast, if the block address changes (Yes in step S41), the semiconductor memory device 10 executes the first read operation. Specifically, the sequencer 17 first executes a tracking read (step S43). Next, the sequencer 17 overwrites the correction value of the read voltage calculated by the tracking read in step S43 in the register REG (step S44), and performs the shift read for the same page with the correction value (step S45). The operations of steps S43 to S45 are the same as the steps S19 to S21 which are described in the first embodiment.

In other words, the semiconductor memory device 10 executes a shift read using the correction value as when the block address has not changed, and executes a shift read in which the correction value is updated by a tracking read when the block address changes. In the read operation of the subsequent page, the above-mentioned step S40 and the subsequent operations are repeated.

The example illustrated in FIG. 16 represents operations when the first read operation by the command set CS1 is executed at the beginning of the read operation, and the block address is changed by the command set CS3 issued at the third time in the subsequent read operations.

As described above, the semiconductor memory device 10 in the memory system 1 according to the present embodiment responds to the command set CS3 issued by the controller 20 and confirms the block address to which data is written, so that the first read operation and second read operations can be used selectively.

3-2. Effect of Third Embodiment

Next, the effect of the third embodiment will be described. By the memory system 1 according to the present embodiment, the same effect as in the first embodiment can be achieved, and it is possible to further speed up the operation than in the first embodiment. This effect will be described in detail below.

As described in the section on the effect of the first embodiment, the influence of the disturbance received by data written in the same block BLK is considered to be almost the same, and it can be inferred that the results of tracking read in the same block BLK are almost the same.

Therefore, the semiconductor memory device 10 in the memory system 1 according to the present embodiment executes the tracking read in response to the command set CS1 including the special command at the beginning of the read operation, and then executes the shift read on the subsequent pages in response to the command set CS3 without including the special command. When detecting that the block address designated by the received command set CS3 changes, the semiconductor memory device 10 executes a tracking read and updates the correction value of the read voltage applied to the subsequent shift reads.

As described above, the memory system 1 according to the present embodiment determines whether or not the semiconductor memory device 10 executes a tracking read, regardless of the instruction of the controller 20. That is, the controller 20 may issue a command set CS1 including a special command only at the beginning of the read operation, and issue a command set CS3 without including a special command in the subsequent read operations.

Thus, in the memory system 1 according to the present embodiment, the controller 20 can shorten the command sequence in the read operation, by not issuing the special command. That is, by the memory system 1 according to the present embodiment, the same effect as in the first embodiment can be achieved, and it is possible to further speed up the operation than in the first embodiment.

4. Fourth Embodiment

Next, a memory system 1 according to a fourth embodiment will be described. The fourth embodiment is described as an example in which a tracking read is executed upon detecting that a specific word line WL is selected within the semiconductor memory device 10, in the read operation described in the second embodiment. In the following, a difference from the first to third embodiments will be described.

4-1. Read Operation of Memory System 1

First, the read operation of the memory system 1 will be described. In the read operation of the memory system 1 according to the present embodiment, the controller 20 issues a first command set CS1 when reading a first page, and issues a third command set CS3 when reading the subsequent pages, similar to the third embodiment. The semiconductor memory device 10 normally executes the second read operation in response to the third command set CS3, and executes the first read operation when the address included in the received third command set CS3 corresponds to a specific word line. As this specific word line, for example, a word line located at the end of each block BLK can be designated.

Figure 17:
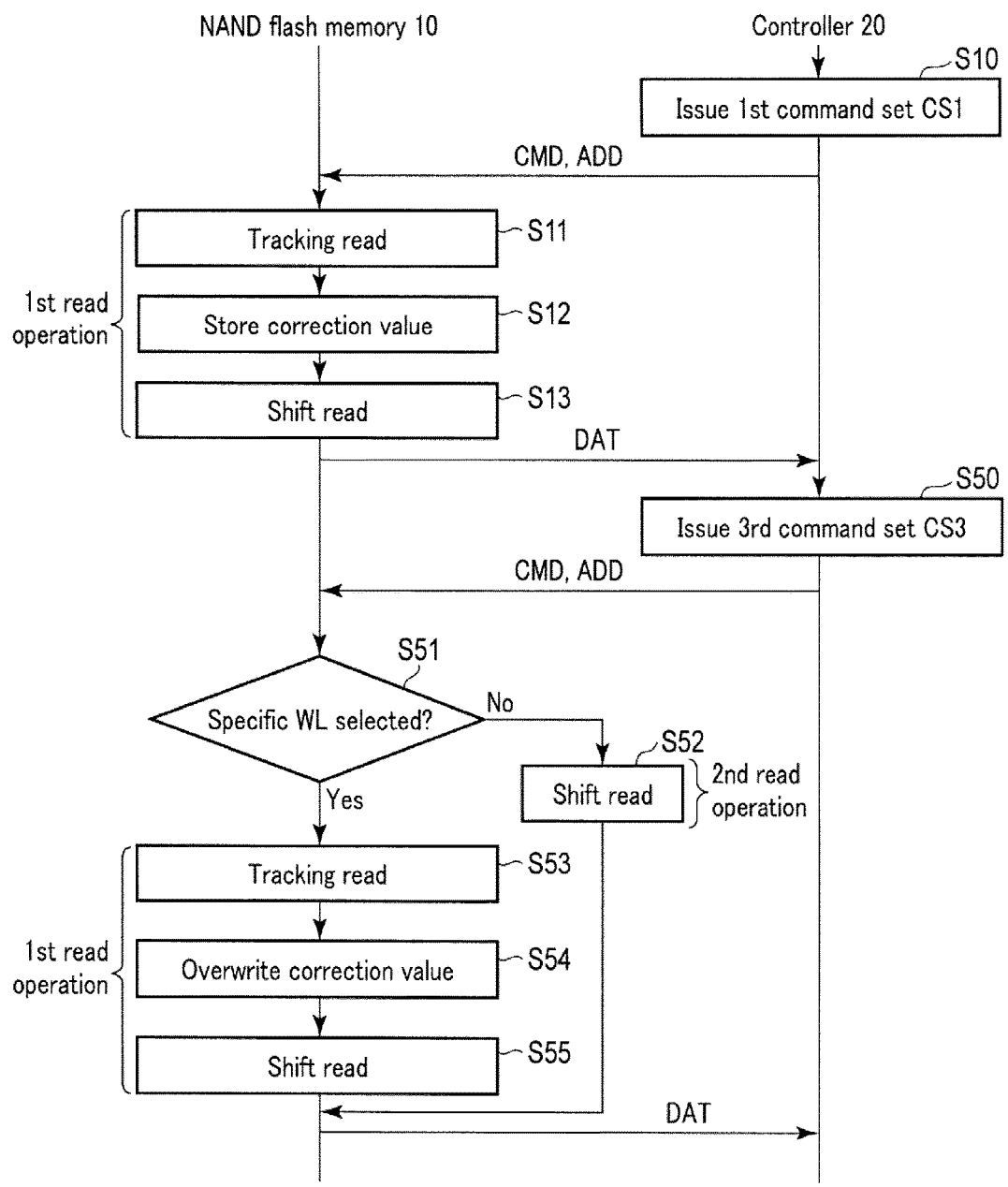
FIG. 17 is a flowchart of a read operation of a memory system according to a fourth embodiment.
Figure 18:
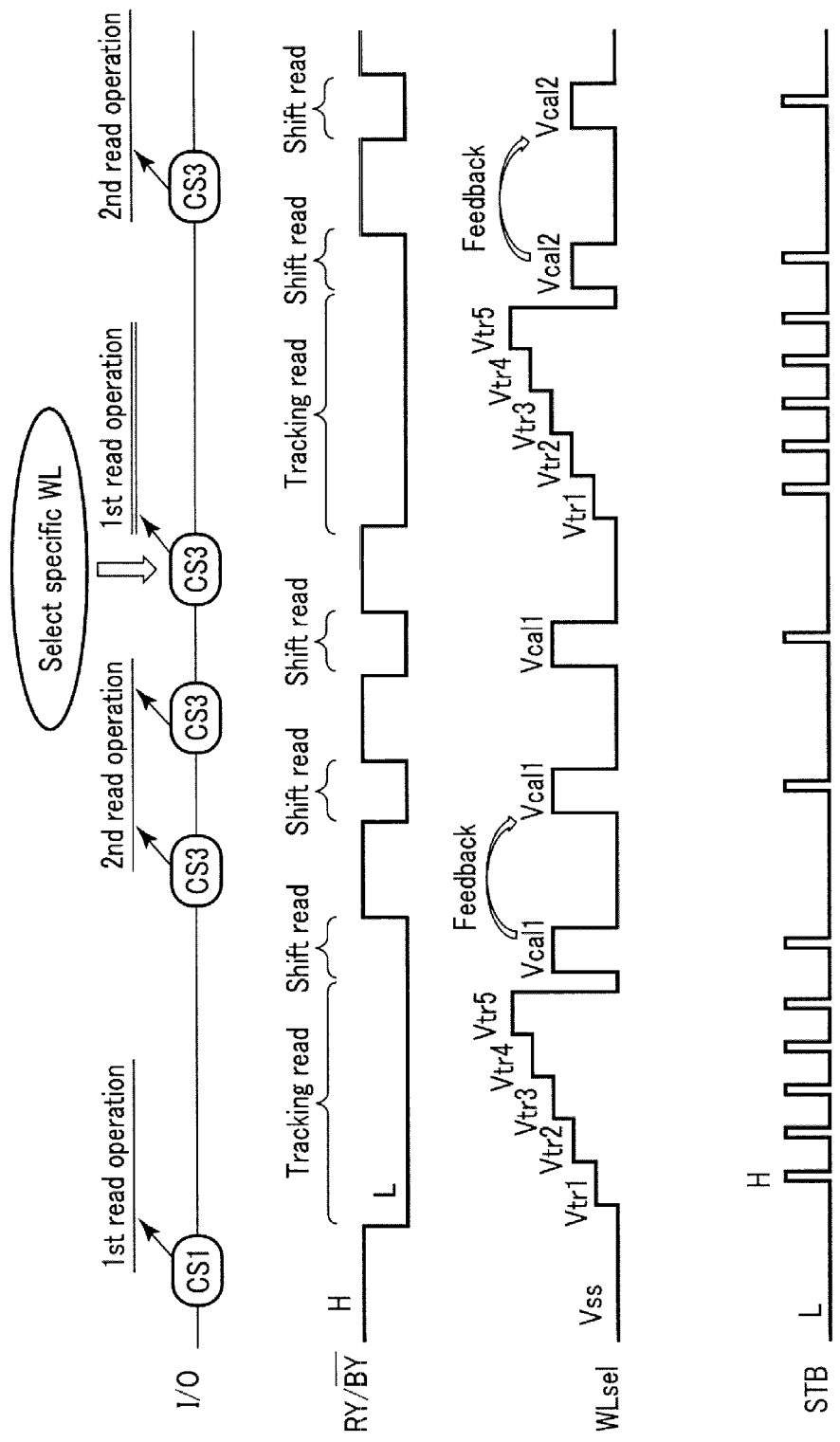
FIG. 18 is a waveform diagram of the read operation of the memory system according to the fourth embodiment.

In the following, the specific example of the read operation of the memory system 1 will be described with reference to FIG. 17 and FIG. 18. FIG. 17 and FIG. 18 respectively illustrate the example of the read operation as a flowchart and a timing chart. WLsel illustrated in FIG. 18 indicates the voltage applied to the selected word line, and the word line corresponding to the WLsel changes as the operation progresses.

As illustrated in FIG. 17, first, the controller 20 issues a first command set CS1 (step S10), and sends the first command set CS1 to the semiconductor memory device 10. Since the operations of the semiconductor memory device 10 based on the command set CS1 illustrated in FIG. 17 and FIG. 18 are the same as in the steps S11 to S13 described in the first embodiment, the explanation thereof will be omitted.

Next, the controller 20 issues a third command set CS3 (step S50), and sends the third command set CS3 to the semiconductor memory device 10. If the semiconductor memory device 10 receives such a command set CS3, the input/output circuit 14 of the semiconductor memory device 10 transfers the received command and address information, to the command register 15C and the address register 15B, respectively. If the command "30h" is stored in the command register 15C, the ready/busy signal is changed from "H" level to "L" level, and the sequencer 17 determines whether or not a specific word line is selected based on the received address information (Step S51). That is, in step S51, the sequencer 17 determines whether or not the word line correlated with the page to be read next is a specific word line.

If the specific word line WL is not selected (No in step S51), the sequencer 17 executes the second read operation. That is, the sequencer 17 executes the shift read, during which the correction value calculated by the most recent tracking read is applied (step S55).

If the specific word line WL is selected (Yes in step S51), the sequencer 17 executes the first read operation. Specifically, the sequencer 17 first executes a tracking read (step S53). Next, the sequencer 17 overwrites the correction value of the read voltage calculated by the tracking read in step S53 in the register REG (step S54), and performs the shift read for the same page with the correction value (step S55). The operations of steps S52 to S54 are the same as the steps S19 to S21 which are described in the first embodiment.

That is, when an address correlated with the specific word line WL is not selected, the semiconductor memory device 10 executes a shift read using the current correction value, and when an address correlated with the specific word line WL is selected, the semiconductor memory device 10 executes a shift read by updating the correction value. In the read operation of the subsequent page, the above-mentioned step S50 and the subsequent operations are repeated.

The example illustrated in FIG. 18 represents operations when the first read operation by the command set CS1 is executed at the beginning of the read operation, and the specific word line WL is selected by the command set CS3 issued at the third time in the subsequent read operations.

As described above, the semiconductor memory device 10 in the memory system 1 according to the present embodiment responds to the command set CS3 issued by the controller 20 and determines whether or not the specific word line WL is selected, so that the first read operation and second read operations can be used selectively.

4-2. Effect of Fourth Embodiment

Next, the effect of the fourth embodiment will be described. By the memory system 1 according to the present embodiment, the same effect as in the third embodiment can be achieved, and it is possible to further speed up the operation than in the third embodiment. This effect will be described in detail below.

In the semiconductor memory device, the characteristics of the memory cell may differ depending on the position where the memory cell is formed. For example, in each NAND string, the characteristic variation across the memory cell located in the center portion is small, and the characteristic variation across the memory cell located at the end becomes large.

When such characteristic variations occur depending on positions, even if a shift read is executed by applying the correction value obtained by the tracking read of another page, re-read may be executed more frequently.

Therefore, similar to the third embodiment, the semiconductor memory device 10 in the memory system 1 according to the present embodiment executes the tracking read in response to the command set CS1 including the special command at the beginning of the read operation, and then executes the shift read on the subsequent pages in response to the command set CS3 without including the special command. When detecting that the specific word line WL is selected by the received command set CS3, the semiconductor memory device 10 executes a tracking read and updates the correction value of the read voltage applied to the subsequent shift reads.

As described above, similar to the third embodiment, the memory system 1 according to the present embodiment determines whether or not the semiconductor memory device 10 executes a tracking read, regardless of the instruction of the controller 20. Therefore, the controller 20 may issue a command set CS1 including a special command only at the beginning of the read operation, and issue a command set CS3 without including a special command in the subsequent read operations.

Thus, in the memory system 1 according to the present embodiment, similar to the third embodiment, the controller 20 can shorten the command sequence in the read operation by not issuing the special command. In the memory system 1 according to the present embodiment, since the semiconductor memory device 10 executes the tracking read with respect to the portion where the possibility of re-read is high, the frequency of re-read can be reduced. That is, by the memory system 1 according to the present embodiment, the same effect as in the third embodiment can be achieved, and it is possible to further speed up the operation than in the third embodiment.

5. Fifth Embodiment

Next, a memory system 1 according to a fifth embodiment will be described. The fifth embodiment is described as an example in which flag information is written in the redundant area of each page, and a tracking read is executed based on this flag information. In the following, a difference from the first to fourth embodiments will be described.

5-1. Operation

5-1-1. Overview of Operation of Memory System 1

First, the overview of the operation of the memory system 1 will be described. In the memory system 1 according to the present embodiment, flag information is used in a write operation and a read operation.

The flag information is information capable of identifying a time when data of the corresponding page is written. As this flag information, for example, information about the time when write data is received from the external host, information referring to a part of the address information, and the like are used.

In the write operation, flag information is generated by the controller 20 and is added to the input/output signal I/O transmitted by the controller 20 to the semiconductor memory device 10. The flag information is written in the redundant area of each page in the semiconductor memory device 10.

In the read operation, the flag information is retrieved before data is read by the semiconductor memory device 10. Then, the semiconductor memory device 10 executes the first read operation including a tracking read, or the second read operation which is a shift read applying the correction value obtained by the most recent tracking read, based on the flag information.

5-1-2. Write Operation of Memory System 1

Figure 19:
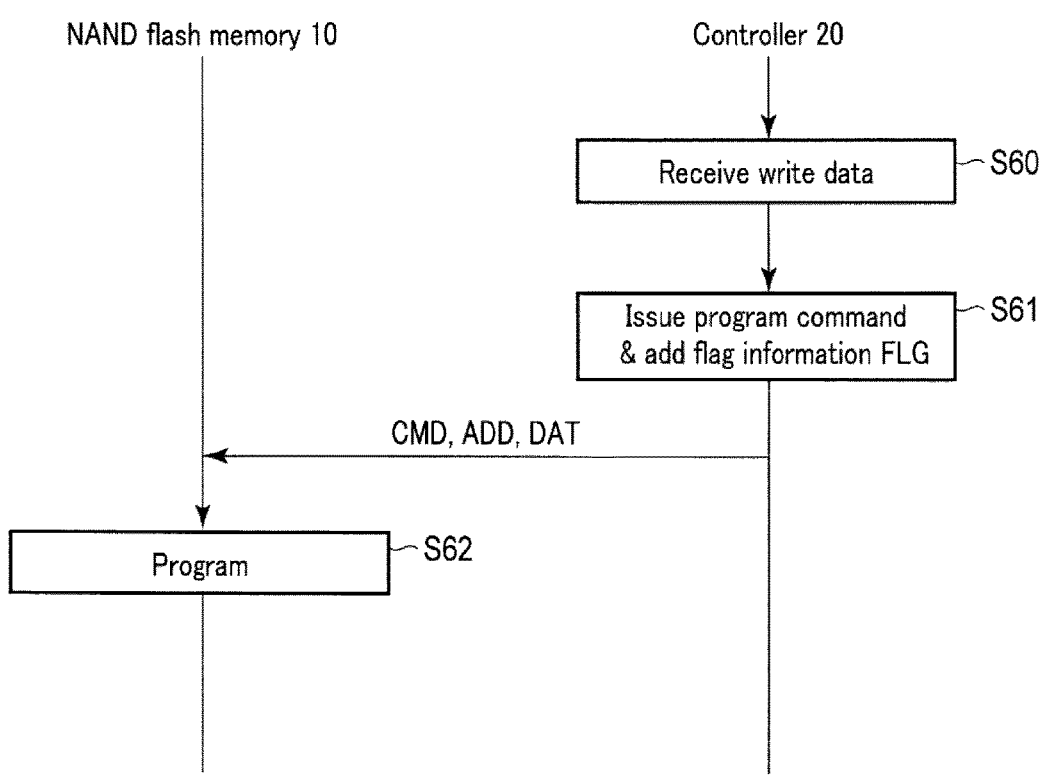
FIG. 19 is a flowchart of a write operation of a memory system in a fifth embodiment.

In the following, the specific example of the write operation of the memory system 1 will be described with reference to FIG. 19. FIG. 19 illustrates an example of a write operation in a flowchart.

As illustrated in FIG. 19, first, the controller 20 receives write data and address information from an external host (not illustrate) (step S60). The write data and the address information are temporarily retained in the buffer memory 25 through the host I/F 26.

Next, the NAND I/F 24 of the controller 20 issues a write command and adds flag information FLG to the write data (step S61). This flag information FLG is added, for example, to the end of the write data so as to be written in the redundant area of the page to be written. Then, the NAND I/F 24 transmits the issued write command, write data including the flag information FLG, and address information, to the semiconductor memory device 10, as an input/output signal I/O.

Next, the semiconductor memory device 10 executes a write operation, based on the write data DAT, the command CMD, and the address information ADD, which are received from the controller 20 (step S62). Thus, data is stored in the data area of the corresponding page, and the flag information FLG is stored in the redundant area.

Alternatively, those other than the NAND I/F 24 may issue a write command in step S61. For example, the CPU 21 may issue a write command. Similarly, those other than the NAND I/F 24 may generate the flag information FLG in step S61. For example, the CPU 21 may generate the flag information FLG and transfer the generated flag information FLG to the NAND I/F 24 or the buffer memory 25 so as to be added to the write data.

In addition, it is preferable that the flag information is stored in a memory cell by applying a single level cell (SLC) method of storing one-bit of data, but any other method can be applied, and the flag information may be stored in the memory cell by applying an MLC method.

5-1-3. Read Operation of Memory System 1

Next, the read operation of the memory system 1 will be described. The memory system 1 according to the present embodiment can execute the read operation described below with one type of command set (for example, the command set CS3). In the read operation, the semiconductor memory device 10 first executes the flag read in response to the command set received from the controller 20, and then executes the first read operation or the second read operation.

The flag read is a read operation of reading the flag information stored in the redundant area of each page. The flag information read by this flag read is transferred to the sequencer 17, and the sequencer 17 executes the first read operation or the second read operation for the page based on this flag information.

Figure 20:
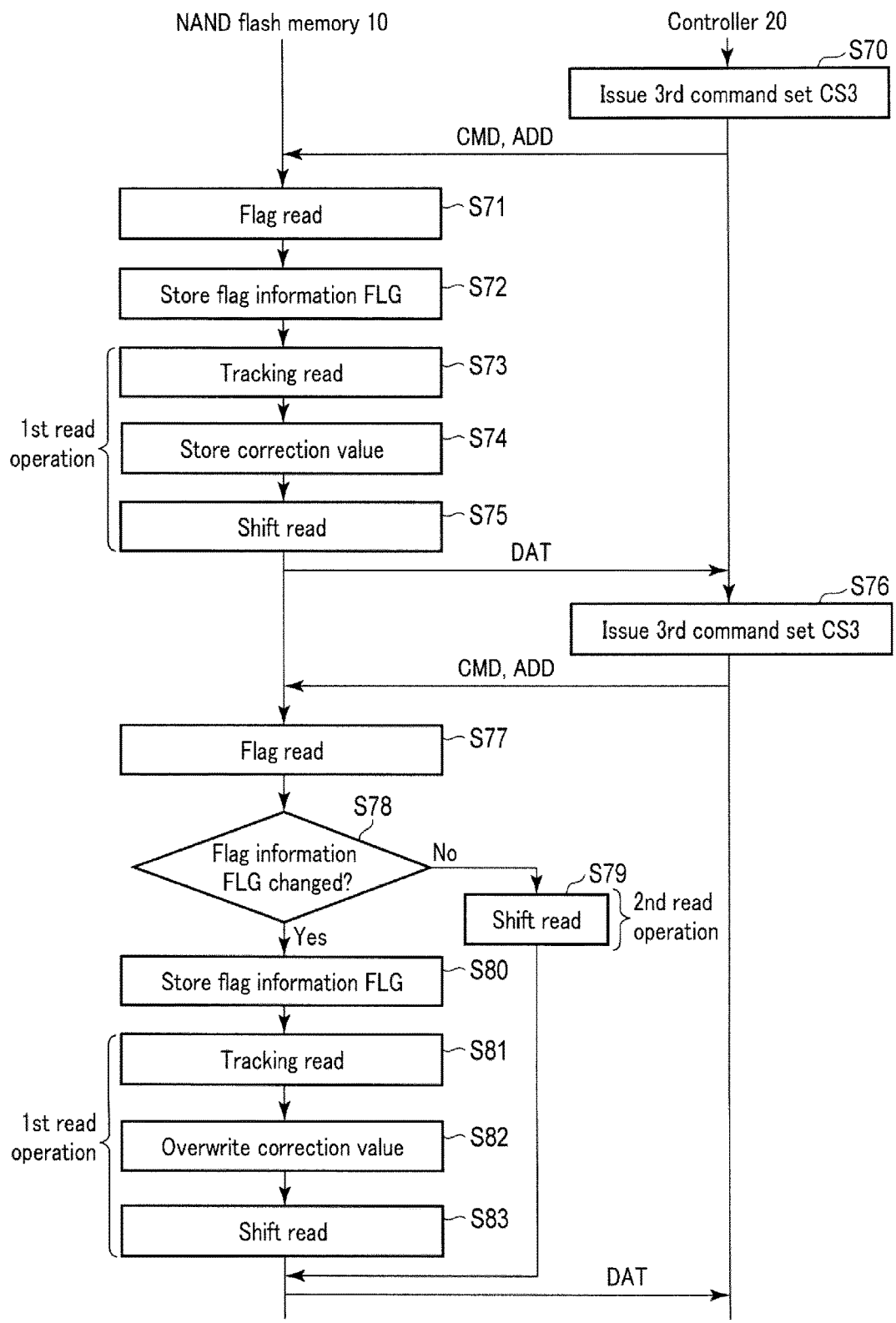
FIG. 20 is a flowchart of the read operation of the memory system according to the fifth embodiment.
Figure 21:
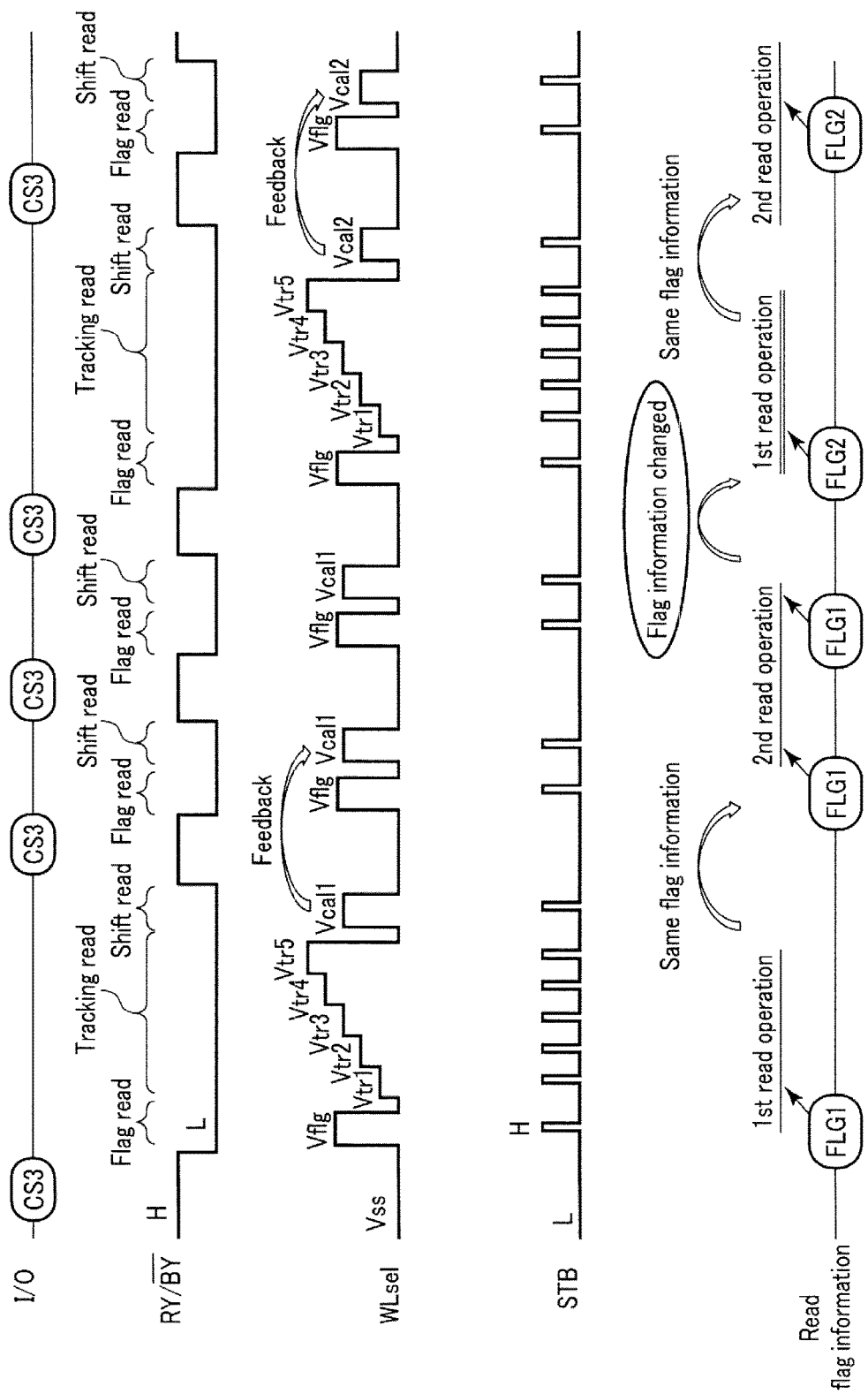
FIG. 21 is a waveform diagram of the read operation of the memory system according to the fifth embodiment.

In the following, the specific example of the read operation of the memory system 1 will be described with reference to FIG. 20 and FIG. 21. FIG. 20 and FIG. 21 respectively illustrate the example of the read operation as a flowchart and a timing chart. WLsel illustrated in FIG. 21 indicates the voltage applied to the selected word line, and the word line corresponding to the WLsel changes appropriately as the operation progresses.

First, the controller 20 issues a third command set CS3 (step S70), and sends the third command set CS3 to the semiconductor memory device 10. If the semiconductor memory device 10 receives such a command set CS3, the input/output circuit 14 of the semiconductor memory device 10 transfers the received command and address information, to the command register 15C and the address register 15B, respectively. If the command "30h" is stored in the command register 15C, the ready/busy signal is changed from "H" level to "L" level, and the sequencer 17 first executes the flag read for the designated page (step S71).

Specifically, for example, as illustrated in FIG. 21, the row decoder 13 applies the read voltage Vflg to the selected word line WLsel. The voltage Vflg is a read voltage for reading the flag information FLG stored in the redundant area of each page, and is set based on the writing method of the flag information FLG. When the sequencer 17 asserts the signal STB while the voltage Vflg is applied to the selected word line WLsel, data is read by the sense amplifier module 12.

Subsequently, the sense amplifier module 12 transfers the flag information FLG included in the redundant area of the one page of the read data to the sequencer 17, and the sequencer 17 retains this flag information in, for example, the register REG (step S72).

Next, the semiconductor memory device 10 executes the first read operation. Specifically, the tracking read is first executed on the page on which the sequencer 17 executes the flag read (step S73). Next, the sequencer 17 stores the correction value of the read voltage calculated by the tracking read, in the register REG (step S74). Subsequently, the sequencer 17 executes the shift read of the same page by applies the correction retained in the register REG (step S75). Since the specific operation is the same as in steps S11 to S13 described in the first embodiment, the explanation thereof will be omitted.

Next, the controller 20 issues a command set CS3 (step S76), and sends the command set CS3 to the semiconductor memory device 10. Then, the sequencer 17 executes a flag read for the page to be read next, based on the command set CS3 (step S77). In other words, the sequencer 17 executes the flag read on the selected word line WLsel different from the word line on which the flag read is executed in step S71. Since the operations of steps S76 and S77 are the same as the operations of steps S70 and S71, the explanation thereof will be omitted.

Next, the sequencer 17 compares the read flag information FLG with the flag information FLG retained in the register REG, and determines whether or not the flag information FLG changes from the previous flag read result (step S78).

If the flag information FLG does not change (No in step S78), the sequencer 17 executes the second read operation. That is, the sequencer 17 executes the shift read, during which the correction value calculated by the most recent tracking read is applied, on a page on which the flag read is executed in step S77 (step S79).

On the other hand, if the flag information FLG changes (Yes, in step S78), the sequencer 17 overwrites the changed flag information FLG to the register REG (step S80), and executes the first write operation. Specifically, the tracking read is first executed on the page on which the sequencer 17 executes the flag read in step S77 (step S81). Next, the sequencer 17 overwrites the correction value of the read voltage calculated by the tracking read in the register REG (step S82), and performs the shift read for the same page with the correction value (step S83). The operations of steps S80 to S82 are the same as the steps S19 to S21 which are described in the first embodiment.

In other words, the semiconductor memory device 10 executes a shift read on the page retaining the same flag information with the correction value as it is, and executes a shift read in which the correction value is updated by a tracking read, when the flag information is changed. In the read operation of the subsequent page, the step S76 and the subsequent operations are repeated.

Further, the example illustrated in FIG. 21 represents operations when the read flag information pieces FLG1 and FLG2 change, in the flag read of the semiconductor memory device 10 by the command set CS3 issued by the controller 20 at the fourth time.

As described above, the semiconductor memory device 10 according to the present embodiment executes the flag read and the tracking read at the beginning of the read operation, and retains the flag information FLG and the correction value of the read voltage in the register REG. In the subsequent read operations, the semiconductor memory device 10 executes a shift read using the same correction value for the page retaining the same flag information, and executes a tracking read every time the flag information is changed.

In the above description, the case where the SLC method is applied when the flag information is written in the redundant area is described as an example, but other cases are possible. For example, when the flag information is written by the MLC method, a read operation using a plurality of read voltages is executed in flag read of the read operation.

In the above description, the case where the read operation is executed using the command set CS3 is described as an example, but other cases are possible. For example, the read operation may be executed using a command set including the special command such as the command set CS1.

5-2. Effect of Fifth Embodiment

Next, the effect of the fifth embodiment will be described. By the memory system 1 according to the present embodiment, the same effect as in the first embodiment can be achieved, and it is possible to further speed up the operation than in the first embodiment. This effect will be described in detail below.

In the memory system 1 according to the first embodiment, the first read operation including a tracking read and the second read operation which is a shift read using a correction value are used selectively by a plurality of command sets.

On the other hand, in the memory system 1 according to the present embodiment, the controller 20 generates flag information indicating a time when each page data is written, and the semiconductor memory device 10 writes this flag information in the redundant area of each page. The semiconductor memory device 10 selectively uses the first read operation and the second read operation, with reference to the flag information during the read operation.

Specifically, the semiconductor memory device 10 first executes a flag read to read the flag information at the time of the read operation of each page. The read flag information is retained in the semiconductor memory device 10, and is compared with the flag information correlated with the page read prior to the corresponding page. Then, the semiconductor memory device 10 executes the first read operation when the compared flag information pieces are different, and executes the second read operation when the compared flag information pieces are the same.

In this way, the semiconductor memory device 10 executes the second read operation on the page storing the same flag information, and updates the correction value of the read voltage by executing the first read operation each time the flag information is changed. That is, the semiconductor memory device 10 can apply the correction value of the same read voltage, for example, in units of files such as image data and document data.

Thus, the memory system 1 according to the present embodiment can define a range using the correction value of the read voltage in units larger than the block, and reduce the frequency of executing the tracking read. That is, by the memory system 1 according to the present embodiment, the same effect as in the first embodiment can be achieved, and it is possible to further speed up the operation than in the first embodiment.

6. Sixth Embodiment

Next, a memory system 1 according to a sixth embodiment will be described. Whereas the controller 20 generates the flag information in the fifth embodiment, the sixth embodiment is described as an example in which the semiconductor memory device 10 generates flag information. In the following, a difference from the first to fifth embodiments will be described.

6-1. Write Operation of Memory System 1

Figure 22:
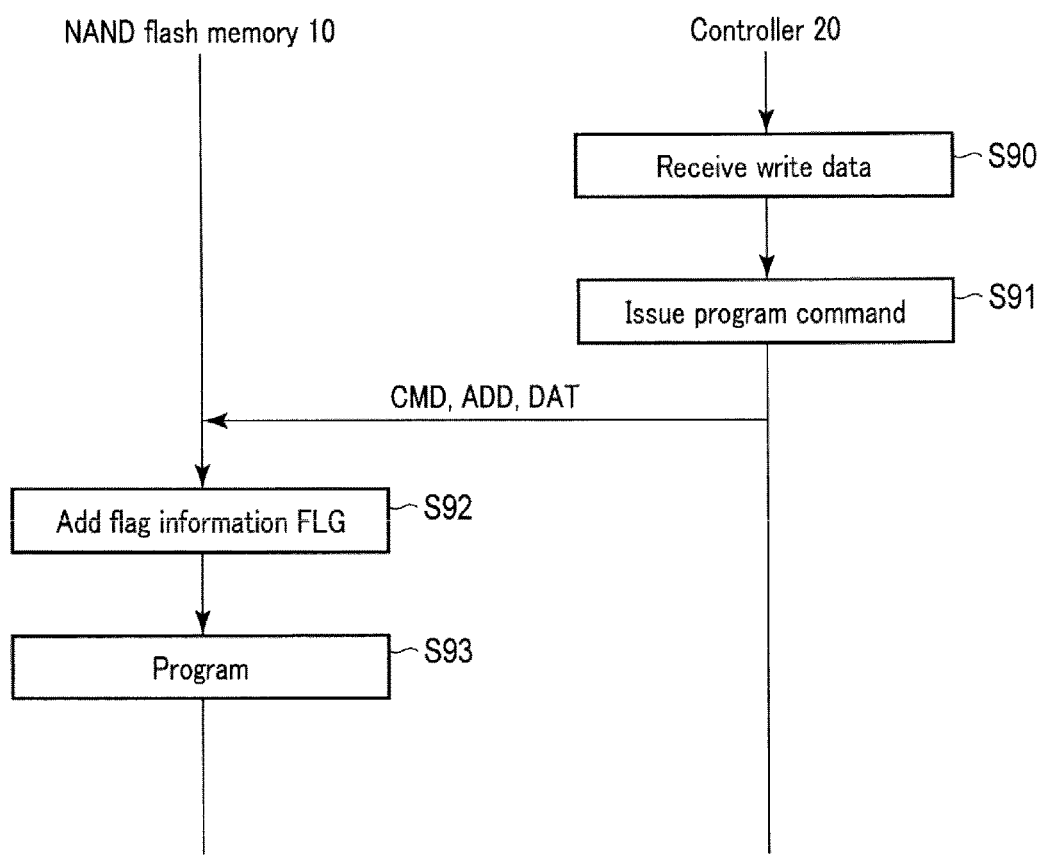
FIG. 22 is a flowchart of a write operation of the memory system according to a sixth embodiment.

First, the specific example of the write operation of the memory system 1 will be described with reference to FIG. 22. FIG. 22 illustrates an example of a write operation in a flowchart.

First, the controller 20 receives write data and address information from an external host (not illustrated) (step S90). The write data and the address information are temporarily retained in the buffer memory 25 through the host I/F 26.

Next, the NAND I/F 24 of the controller 20 issues a write command (step S91). Then, the NAND I/F 24 transmits the issued write command, write data, and address information, to the semiconductor memory device 10, as an input/output signal I/O.

Next, the input/output circuit 14 of the semiconductor memory device 10 transfers the command CMD, the address information ADD, and the write data DAT, which are received from the controller 20, to a command register 15C, the address register 15B, and the latch circuit XDL of the sense amplifier module 12, respectively. Then, the sequencer 17 generates flag information (step S92) and transfers the flag information to the latch circuit XDL of the sense amplifier unit SAU connected to the memory cell in the redundant area. As this flag information, for example, a part of the received address information is used.

Next, the sequencer 17 executes the write operation based on the command CMD transferred to the command register 15C (step S93). Thus, data is written in the data area of the corresponding page, and flag information is written in the redundant area.

The flag information written in this redundant area is set to the same flag information FLG while executing, for example, a cache write operation. The cache write operation is used to execute the transfer of one page of data from the controller 20 to the semiconductor memory device 10 and the write operation of one page of data of the semiconductor memory device 10 in parallel.

Figure 23:
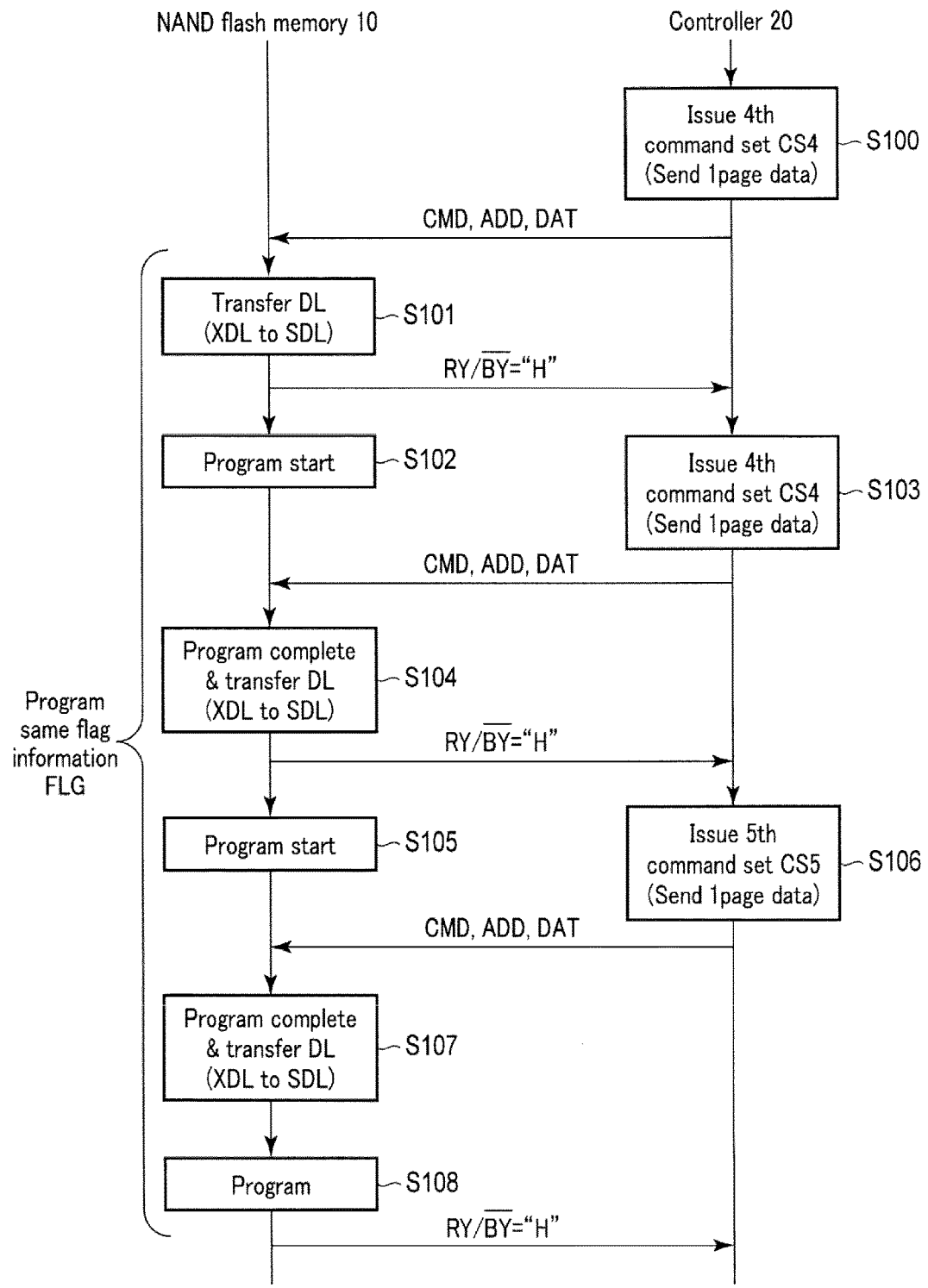
FIG. 23 is a flowchart of the write operation of the memory system according to the sixth embodiment.

In the following, the specific example of the cache write operation will be described with reference to FIG. 23. FIG. 23 illustrates an example of the cache write operation in a flowchart.

Figure 24:
FIG. 24 is a command sequence of the write operation of the memory system according to the sixth embodiment.

As illustrated in FIG. 23, first, the controller 20 issues a fourth command set CS4 (step S100), and sends the fourth command set CS4 to the semiconductor memory device 10. The command sequence corresponding to this fourth command set CS4 is illustrated in FIG. 24.

Specifically, the controller 20 first issues a write command "80h", and then sends the write command "80h" to the semiconductor memory device 10. The command "80h" is a command instructing write operation. Next, the controller 20 issues address information ADD, for example, for five cycles, and sends the information ADD to the semiconductor memory device 10. This address information ADD is used to designate the address. Next, the controller 20 outputs write data Din, for example, for a plurality of cycles to the semiconductor memory device 10. The data Din output corresponds to data of one page in total. Next, the controller 20 issues the command "15h" and sends it to the semiconductor memory device 10. The command "15h" is a command for causing the semiconductor memory device 10 to execute a cache write operation based on the address information and data Din which are sent immediately before.

If the semiconductor memory device 10 receives such a command set CS4 (command CMD, address information ADD, and write data DAT), the input/output circuit 14 of the semiconductor memory device 10 transfers the received command, address information, and write data to the command register 15C, the address register 15B, and the latch circuit XDL of the sense amplifier module 12, respectively. If the command "15h" is stored in the command register 15C, the ready/busy signal is changed from "H" level to "L" level, and the sequencer 17 starts a cache write operation.

In the cache write operation, first, the sense amplifier module 12 transfers the write data which is transferred to the latch circuit XDL, to the latch circuit SDL (step S101). Upon detecting completion of the data transfer in step S101, the sequencer 17 controls the ready/busy control circuit 18 so as to change the ready/busy signal from "L" level to "H" level.

Subsequently, the sequencer 17 starts a write operation of 1 page data (step S102). The controller 20 issues a fourth command set CS4 including the write data of the next page (step S103) in parallel with the start of a write operation by the semiconductor memory device 10, and sends the fourth command set CS4 to the semiconductor memory device 10. The transmitted write data in step S103 is retained in the latch circuit XDL of the sense amplifier module 12 through the input/output circuit 14.

If the write operation is completed, the sequencer 17 controls the sense amplifier module 12 so as to transfer the write data which is transferred to the latch circuit XDL, to the latch circuit SDL (step S104). The sequencer 17 sets the ready/busy signal to "L" level while performing data transfer in step S104, and changes the ready/busy signal to "H" level, if data transfer is completed.

As described above, in the cache write operation, the transfer of write data from the controller 20 to the semiconductor memory device 10, and the write operation of the semiconductor memory device 10 are executed in parallel. The operations of steps S102 to S104 are repeated until the amount of the data to be written to the semiconductor memory device 10 is equal to or less than one page.

If the amount of write data is equal to or less than one page, the controller 20 issues a fifth command set CS5 instructing a normal write operation (step S106), and sends the fifth command set CS5 to the semiconductor memory device 10. The command sequence corresponding to this fifth command set CS5 is illustrated in FIG. 24.

Specifically, the command set CS5 is similar to the command set CS4, except that the command "15h" is replaced with a command "10h". The command "10h" is a command for causing the semiconductor memory device 10 to execute a normal write operation based on the address information and data Din which are sent immediately before.

If the semiconductor memory device 10 receives such a command set CS5 (command CMD, address information ADD, and write data DAT), the input/output circuit 14 of the semiconductor memory device 10 transfers the received command, address information, and write data to the command register 15C, the address register 15B, and the latch circuit XDL of the sense amplifier module 12, respectively. If the command "10h" is stored in the command register 15C, the ready/busy signal is changed from "H" level to "L" level, and the sequencer 17 starts a normal write operation.

If the write operation of the previous page is completed, the sense amplifier module 12 transfers the write data which is transferred to the latch circuit XDL, to the latch circuit SDL (step S107). Subsequently, the sequencer 17 executes a write operation of remaining 1 page data (step S108). If the write operation is completed, the sequencer 17 controls the ready/busy control circuit 18 so as to set the ready/busy signal to "H" level.

The command sequence illustrated in FIG. 24 corresponds to the flowchart illustrated in FIG. 23. Specifically, FIG. 24 illustrates a command sequence when 3 pages of data are written with two cache write operations and one normal write operation.

tDLtrans and tProg indicated in FIG. 24 respectively correspond to a period during which data transfer between latches is performed in the cache write operation and a period during which a normal write operation is executed, and it is established that tDLtrans<tProg. As described above, in the cache write operation, the write operation of 1 page data by the semiconductor memory device 10 may be completed while the controller 20 transmits the input/output signal I/O.

As described above, in the cache write operation, 1 page data is written continuously based on the command set CS4. In the semiconductor memory device 10 according to the present embodiment, for example, the same flag information FLG is shared, with the cache write operation to be continuously executed and the last normal write operation as one group.

In other words, the semiconductor memory device 10 according to the present embodiment writes the same flag information FLG to the redundant area of each page, until the normal write operation is executed by the command set CS5 after the cache write operation based on the command set CS4 is started. In this embodiment, the timing at which the sequencer 17 of the semiconductor memory device 10 generates the flag information FLG and transfers the flag information FLG to the corresponding sense amplifier unit SAU may be a period during reception of each command set, or a time before data transfer between latches is performed after the command "15h" or the command "10h" are received.

In the above description, the latch circuit LDL or UDL other than the latch circuit SDL may be used as a destination latch circuit to which data is transferred from the latch circuit XLD based on the commands "15h" and "10h".

In addition, when the controller 20 is configured to know the operation state of the semiconductor memory device 10 by a status read command, the controller 20 issues the status read command at predetermined intervals after issuing each command set. Then, the controller 20 detects completion of the data transfer in the step S102, S104, or S107, with reference to the status information output from the semiconductor memory device 10.

The cache read operation described above is described, for example, in U.S. patent application Ser. No. 10/318,167 filed on Dec. 13, 2002, entitled "SEMICONDUCTOR INTEGRATED CIRCUIT ADAPTED TO OUTPUT PASS/FAIL RESULTS OF INTERNAL OPERATIONS." This patent application is incorporated herein by reference in its entirety.

6-2. Effects of Sixth Embodiment

Next, the effect of the sixth embodiment will be described. By the memory system 1 according to the present embodiment, the same effect as in the fifth embodiment can be achieved. This effect will be described in detail below.

Whereas the controller 20 generates the flag information FLG in the memory system 1 according to the fifth embodiment, the semiconductor memory device 10 generates the flag information FLG in the memory system 1 according to the present embodiment. In this manner, the flag information FLG may be generated within the semiconductor memory device 10, and the semiconductor memory device 10 executes writing of the flag information FLG together with the data received from the controller 20.

With this, by the memory system 1 according to the present embodiment, the same read operation can be operated as in the fifth embodiment. That is, the memory system 1 according to the present embodiment can reduce the frequency of executing the tracking read, and can achieve the same effect as in the fifth embodiment.

Further, the semiconductor memory device 10 according to the present embodiment generates flag information regardless of the command issued by the controller 20. That is, the semiconductor memory device 10 according to the present embodiment can execute the write operation and the read operation, without causing the controller 20 to use a special command sequence.

7. Modification Example or the Like

A semiconductor memory device <10 in FIG. 1> according to the embodiment includes a plurality of first and second memory cells, first and second word lines which are respectively connected to the plurality of first and second memory cells, and a control circuit that executes a read operation in response to each of externally received first and second command sets <CS1 and CS2 in FIG. 9>. The control circuit can execute the first and second read sequences during the read operation. In the first read sequence <tracking read in FIG. 9>, respective pieces of data are read using first to third voltages which are different from each other. In the second read sequence <shift read in FIG. 9>, data is read using a voltage based on the result of the first read sequence. In read operations of a plurality of first memory cells based on the first command set, first and second read sequences are sequentially executed. In the read operations of a plurality of second memory cells based on the second command set, subsequent to the read operations of the plurality of first memory cells, the second read sequence is executed using a voltage based on the result of the first read sequence in the read operation of the plurality of first memory cells.

In addition, the memory system <1 in FIG. 1> according to the above embodiment includes a semiconductor memory device <10 in FIG. 1> according to the above embodiment and a controller <20 in FIG. 1> capable of issuing first and second command sets.

Thus, it is possible to provide a semiconductor memory device and a memory system, which can speed up an operation.

Any embodiments other than the above first to sixth embodiments are possible, and various modifications are possible. For example, with respect to the embodiment, the case of reading one page of data from the memory cells connected to the same word line WL is described as an example, but other cases are possible. For example, the embodiment can also be applied to the case of reading data of two pages or more from the memory cells connected to the same word line WL, or the case of reading one page of data out of a plurality of pages from the memory cells connected to the same word line WL.

For example, in the case of reading data of two pages or more from the memory cells connected to the same word line WL, or the case of reading one page of data out of a plurality of pages from the memory cells connected to the same word line WL, a plurality of levels of read operations are required to determine page data to be read. In this case, after the tracking reads correlated with the respective levels are consecutively executed, the shift reads correlated with the respective levels are executed thereafter to which the correction value obtained by these tracking reads are applied.

The memory cell stores a plurality of bits of information as described above. When the read voltages correlated with a plurality of levels of threshold voltage distributions are used, the correction value of the read voltage is calculated for each read voltage correlated with each level and is retained in the register REG within the sequencer 17.

In the above embodiment, with respect to the method of calculating the correction value in the tracking read, the case where the difference in the number of on-cells is used is described as an example, but any other cases are possible. For example, when the semiconductor memory device 10 includes an ECC circuit, a read voltage by which the number of error bits is the smallest in the tracking read may be used as an optimum read voltage. In this case, the optimum read voltage may be a read voltage different from the read voltage applied in the tracking read.

In the above embodiment, the case where the register REG in the sequencer 17 is used as the destination for storing the correction value of the read voltage obtained by the tracking read by the semiconductor memory device 10 is described as an example, but any other cases are possible. For example, an area for retaining the correction value may be formed in the area of the register 15, or may be formed in the inside of the semiconductor memory device 10.

In the above embodiment, the case where the correction values of the read voltages obtained by the second and subsequent tracking reads by the semiconductor memory device 10 are overwritten to the previously obtained correction value is described as an example, but any other cases are possible. For example, the correction value obtained by the tracking read may not be overwritten, but may be stored in a different place. Even in this case, if a new correction value is retrieved in the subsequent shift reads, it is possible to achieve the effect as described in the above embodiment.

Further, in the above embodiment, there is a period during which voltage is not applied between the tracking read and the shift read in the first read operation, but any other cases are possible. For example, after the tracking read is executed, the shift read may be executed consecutively. In this case, the correction value of the optimum read voltage is calculated in a state in which the read voltage is applied in the tracking read, and then the read voltage using the calculated correction is applied.

In the above embodiment, the case where the read voltage used for the shift read is set by the correction value obtained by the tracking read is described as an example, but other cases are possible. For example, the correction value from the normal read voltage is not calculated by the tracking read, but an optimum read voltage value itself may be calculated, and stored in the register REG of the sequencer 17. In the shift read in this case, a read operation uses the optimum read voltage stored in the register REG as is.

In the above embodiment, the optimum read voltage, to which the correction value obtained by the tracking read is applied, may not be any one of the plurality of read voltages applied to the tracking read. Instead of using one of the voltages Vtr1 to Vtr5 illustrated in FIG. 6, a voltage between these voltages may be designated as the optimum read voltage.

In the second to fourth embodiments, the case where the first command set CS1 is used to execute the first read operation including the tracking read at the beginning of the read operation is described as an example, but any other cases are possible. For example, it may be set to execute the first read operation, when the semiconductor memory device 10 receives the third command set CS3 from the controller 20 at the beginning of the read operation. In this case, the operations of the second to fourth embodiments can be executed without using the command set CS1 including the special command.

Figure 25:
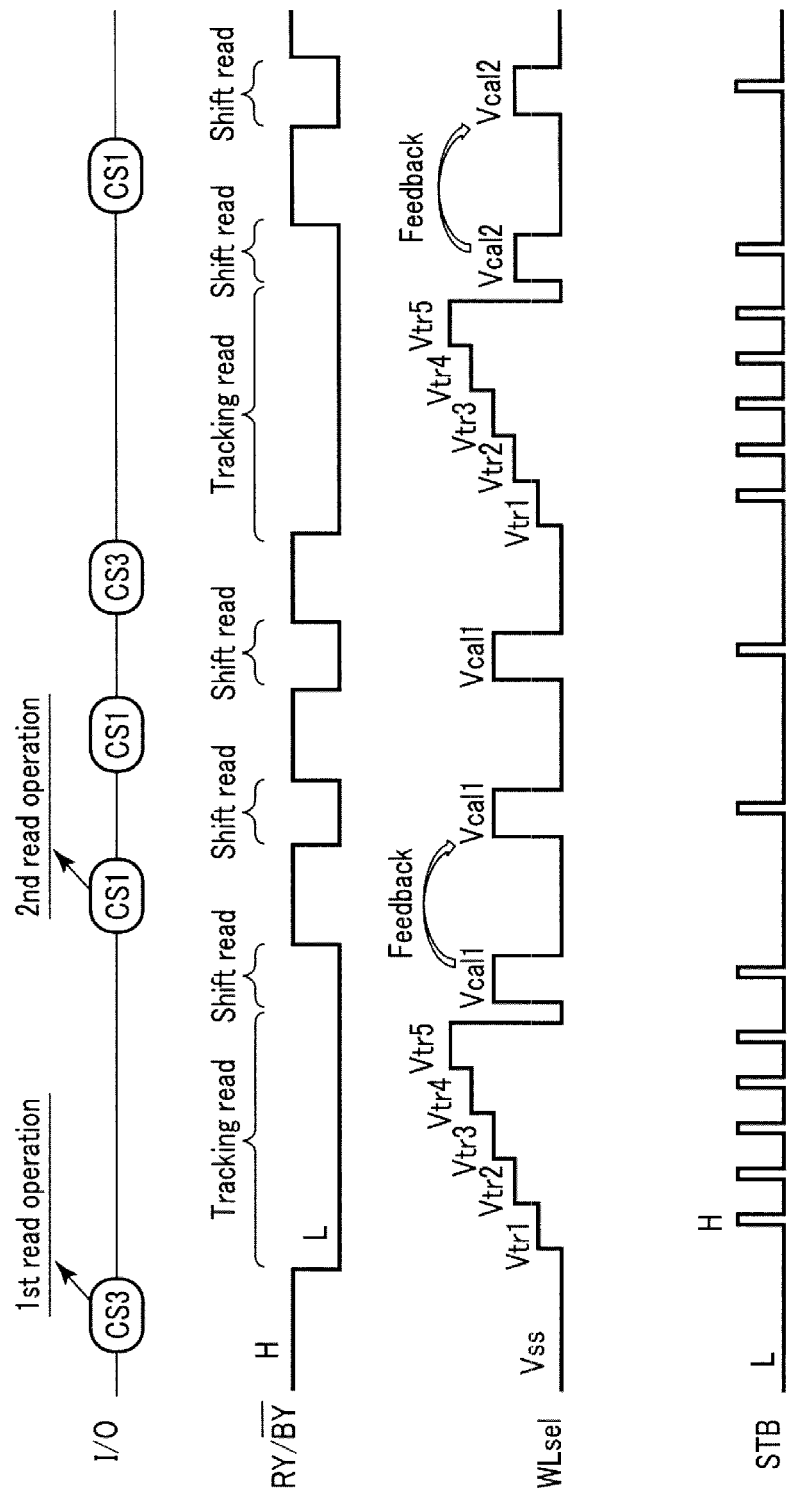
FIG. 25 is a waveform diagram of a read operation of a memory system according to a first modification example.

In the second to the fourth embodiments, the first read operation may be executed based on the third command set, and the second read operation which is the shift read, during which the most recent tracking read result is applied, may be executed based on the first command set. Another example of the command sequence and the waveform in this case is illustrated in FIG. 25. In FIG. 25, the type of the command set instructing the first and second read operations is different from FIG. 9 illustrated in the second embodiment. Incidentally, this operation can be similarly applied to the third and fourth embodiments.

In the fifth and sixth embodiments, when data to be written is less than one page, data may be written from the unwritten area of the page in the subsequent write operation. In this way, as flag information for a page including memory cells with different write timings, flag information at the timing when writing is performed at the beginning of the page may be added, or flag information at the timing when writing is performed at the end of page may be added.

In the above embodiment, the case is described as an example where the correction value of the optimum read voltage is calculated and the first read operation for executing the read operation based on the correction value is a pair of the tracking read and the shift read, but any other cases are possible. For example, only the tracking read may be executed in the first read operation, and optimum data may be extracted from the read result of the tracking read.

Figure 26:
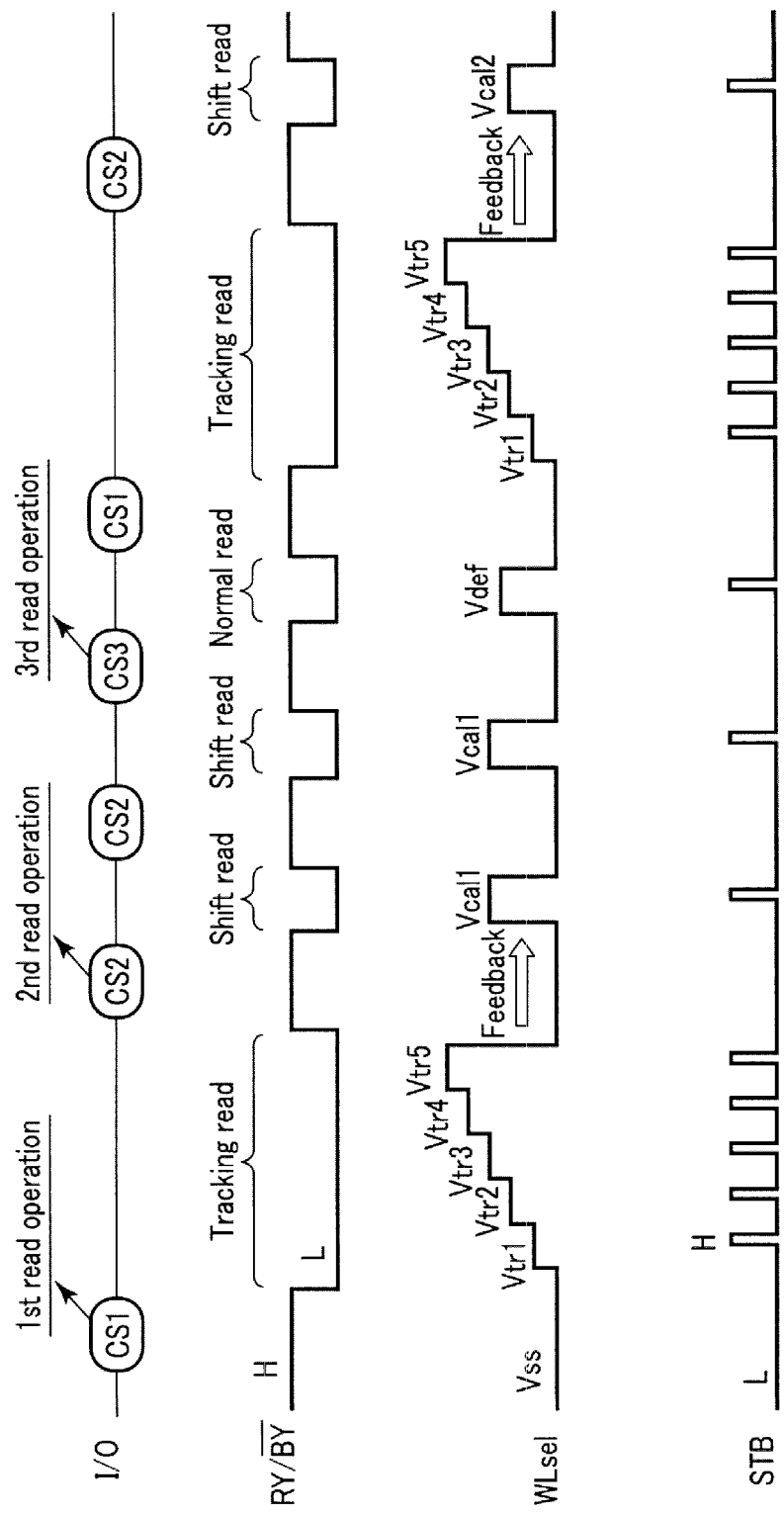
FIG. 26 is a waveform diagram of a read operation of the memory system according to a second modification example.

In this case, for example, all pieces of data read by the tracking read are retained in the sense amplifier module 12. After calculating the correction value of the optimum read voltage, the sequencer 17 controls the sense amplifier module 12 so as to transfer read data based on this correction value or data correlated with the read data close thereto to the latch circuit XDL, and output the read data or the correlated data to the controller 20 through the input/output circuit 14. An example of the command sequence and the waveform in the case where such an operation is applied to the first embodiment is illustrated n FIG. 26. FIG. 26 is different from FIG. 9 described in the first embodiment in that the shift read in the first read operation is omitted. Even in such a case, a shift read in which the result of the most recent tracking read can be executed. In addition, this operation can be similarly applied to the second to sixth embodiments.

Figure 27:
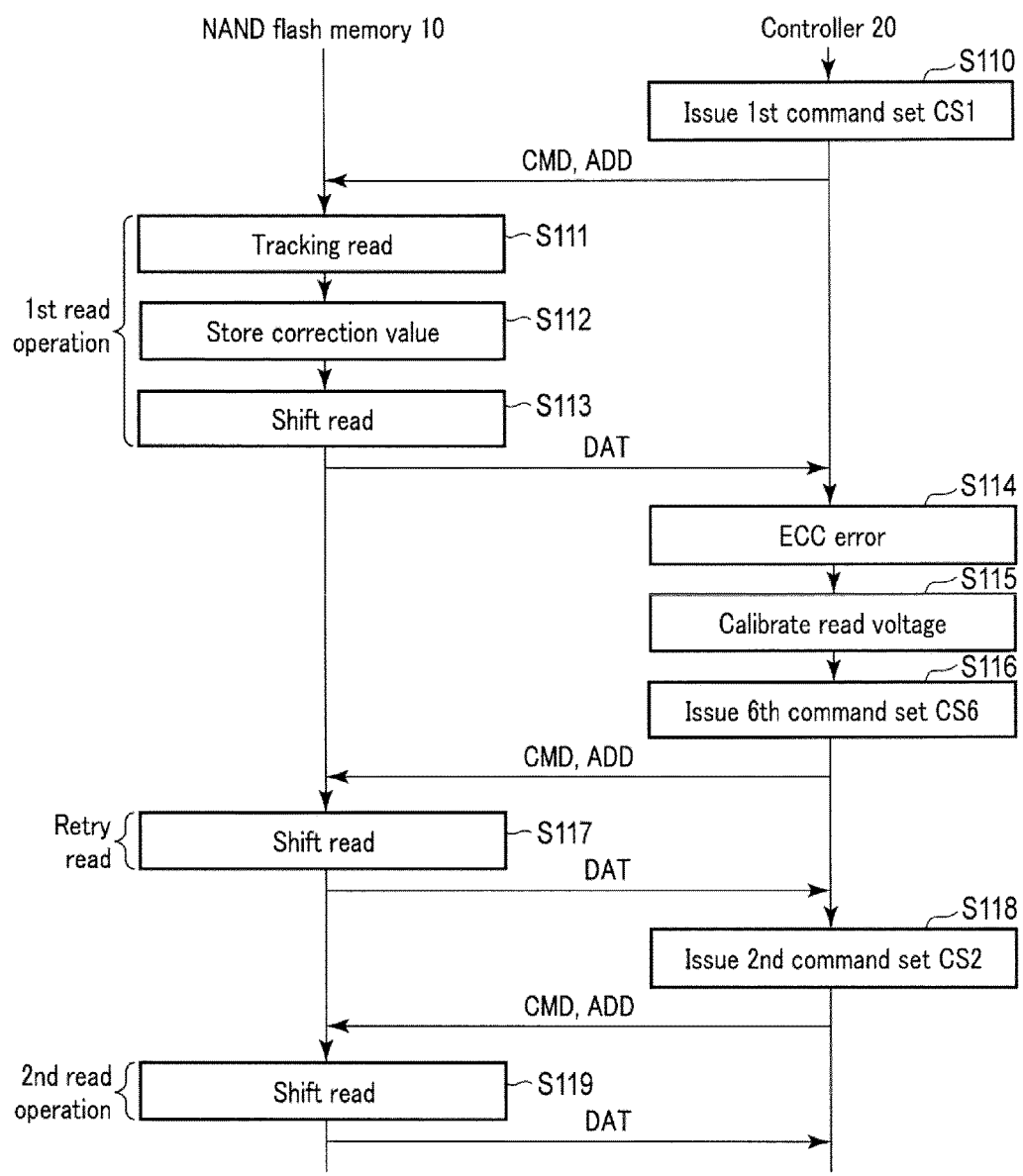
FIG. 27 is a flowchart of a read operation of the memory system according to a third modification example.
Figure 28:
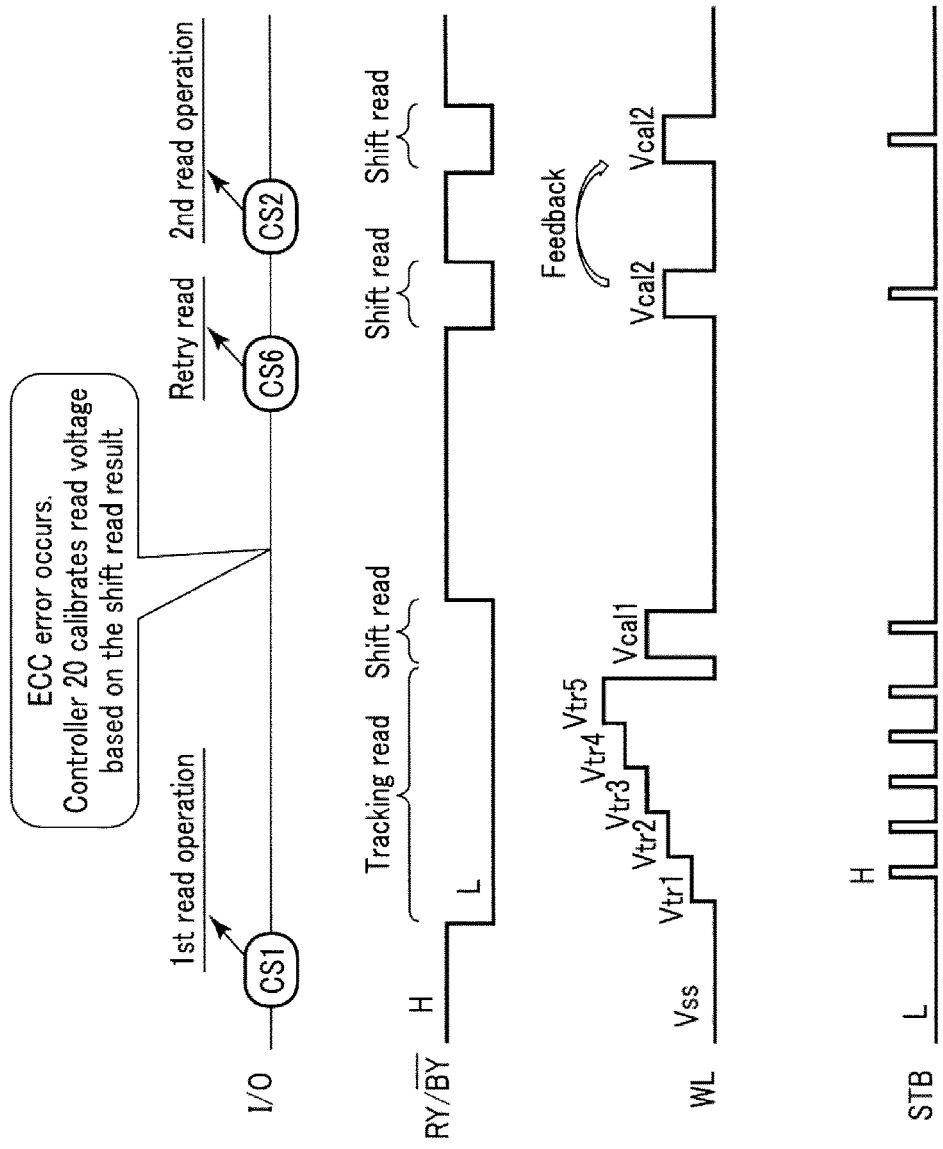
FIG. 28 is a waveform diagram of the read operation of the memory system according to the third modification example.

In the above-described embodiment, the data read in the first to third read operations sometimes fails in the error correction of the controller 20 (ECC error). When such an ECC error occurs, the controller 20 may calculate the correction value of the optimum read voltage based on this read data, and execute a retry read on a portion which is failed in the reading of data. An example of a case where a retry read occurs in the operation of the memory system 1 described in the first embodiment will be described below with reference to FIG. 27 and FIG. 28. FIG. 27 and FIG. 28 respectively illustrate the example of the retry read as a flowchart and a timing chart.

As illustrated in FIG. 27, first, the controller 20 issues a first command set CS1 (step S110), and sends the first command set CS1 to the semiconductor memory device 10. Then, the semiconductor memory device 10 performs a first read operation in response to the command set CS1. Specifically, the sequencer 17 performs tracking read (step S111), stores a correction value obtained by the tracking read (step S112), and performs shift read based on the correction value (step S113). The operations of step S110 to S113 are the same as the steps S10 to S13 which are described with reference to FIG. 8 in the first embodiment.

When receiving data DAT which is read by the shift read in step S113, the controller 20 performs an error correction process. In this example, the controller 20 fails in error correction of the read data (step S114). If such an ECC error occurs, the controller 20 calculates an optimum read voltage based on the data DAT which is read by the shift read in step S113 (step S115). The controller 20 issues a sixth command set CS6 instructing a retry read using the calculated optimum read voltage (step S116), and sends the sixth command set CS6 to the semiconductor memory device 10.

Figure 29:
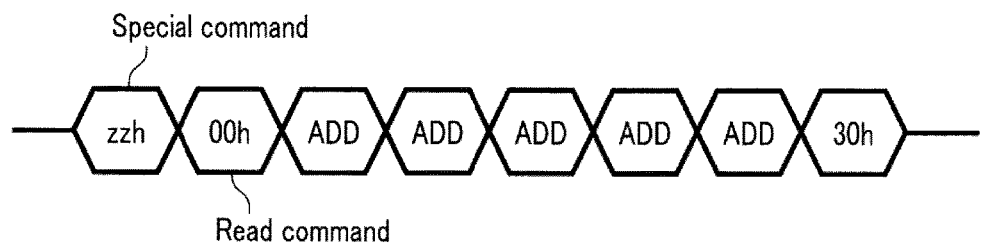
FIG. 29 is a command sequence of the read operation of the memory system that is applied in the third modification example.

The sixth command set CS6 is a command sequence as illustrated in FIG. 29. Specifically, the command set CS6 is similar to the command set CS1 illustrated in FIG. 10, except that the special command "xxh" is replaced with a special command "zzh". The command "zzh" instructs the semiconductor memory device 10 to perform the shift read using the read voltage designated by the controller 20.

The semiconductor memory device 10 that receives the command set CS6 (commands CMD and address information ADD) performs the shift read using the optimum read voltage calculated by the controller 20, on the same page as in step S113 (step S117). In other words, the semiconductor memory device 10 performs a retry read using the optimum read voltage calculated by the controller 20, on the page in which an ECC error occurs. The correction value correlated with the optimum read voltage that the semiconductor memory device 10 receives from the controller 20 at this time is retained in the register REG in the sequencer 17.

If the data DAT read by the shift read in step S117 is sent to the controller 20, the controller 20 issues a second command set CS2. When receiving the second command set CS2 from the controller 20, the semiconductor memory device 10 performs the shift read using the read voltage which is used in step S117, on the subsequent page. In other words, in a second read operation which is subsequently executed when an ECC error occurs and retry read is executed, the correction value of the read voltage calculated by the controller 20 in the most recent retry read is applied.

The waveform illustrated in FIG. 28 corresponds to the operations of steps S110 to S119 described above. In the example illustrated in FIG. 28, the shift read by the voltage Vcal1 is executed at the first read operation at the beginning. In the subsequent retry read, the shift read by the optimum read voltage Vcal2 calculated by the controller 20 is executed. In the second read operation after the retry read, the shift read by a feedback voltage of the read voltage used in the retry read is executed.

As described above, the memory system 1 can also apply the optimum read voltage calculated by the controller 20 in the retry read to the subsequent second read operation. In addition, the controller 20 can shorten the time required to calculate an optimum value, by calculating the optimum read voltage based on the data read by shift read, when an ECC error occurs.

The correction value based on the calculation by the controller 20, which is retained in the semiconductor memory device 10, is updated when the first read operation or the retry read is next executed. In the above description, the case where the ECC error occurs in the first read operation is described as an example, but any other cases are possible. Even when an ECC error occurs, for example, in the second and third read operations, the retry read as described above can be executed.

In the above description, the case is described as an example where the controller 20 issues the sixth command set CS6 when instructing the semiconductor memory device 10 to perform the retry read, but any other instructions may be given. For example, the controller 20 instructs the semiconductor memory device 10 to execute an operation to change an operation mode of the semiconductor memory device 10, referred to as "Set feature", or an operation to change various parameters of the semiconductor memory device 10, referred to as "Parameter set", so that the optimum read voltage calculated by the controller 20 may be applied to the semiconductor memory device 10. In this case, after the controller 20 changes the operation mode or the parameter of the semiconductor memory device 10 in the Set feature or the like, a command set (for example, a command set CS2) instructing a shift read using the correction value is issued. An example of the command sequence in which the controller 20 instructs the semiconductor memory device 10 to execute Set feature is illustrated in FIG. 30.

Figure 30:
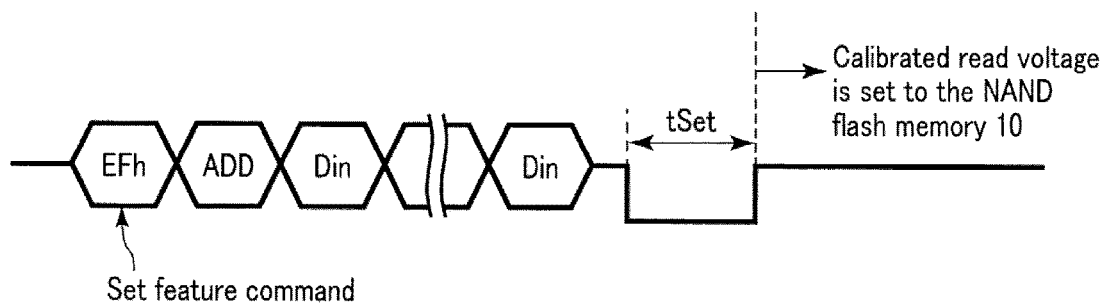
FIG. 30 is a command sequence for setting a correction value for a read voltage used in the read operation of the memory system according to the third modification example.

As illustrated in FIG. 30, first, the controller 20 issues, for example, a Set feature command "EFH", and sends the Set feature command "EFH" to the semiconductor memory device 10. The command "EFh" is a command instructing the semiconductor memory device 10 to change the parameter. Next, the controller 20 issues address information ADD, and sends the address information ADD to the semiconductor memory device 10. This address information ADD is used to designate the address correlated with the parameter to be changed. Next, the controller 20 outputs set data Din for a plurality of cycles, to the semiconductor memory device 10. The output data Din corresponds to a parameter to be changed.

Upon receipt of these commands, or the like, the semiconductor memory device 10 starts the Set feature, and the operation mode of the semiconductor memory device 10 is changed. In this example, the correction value of the read voltage retained in the semiconductor memory device 10 is changed based on the optimum read voltage calculated by the controller 20, by the Set feature. The illustrated tSet indicates the period during which the set feature is performed, and the semiconductor memory device 10 becomes a busy state during this period, In other words, when issuing a command set instructing a shift read using the correction value, after the operation mode or the parameter of the semiconductor memory device 10 is changed by the Set feature or the like, the semiconductor memory device 10 becomes a busy state temporarily before the semiconductor memory device 10 executes a retry read.

In addition, the correction value of the read voltage set by the Set feature may be retained separately from the correction value of the read voltage calculated by the semiconductor memory device 10. In this case, the semiconductor memory device 10 executes a shift read in which the correction value designated by Set feature or the like is applied to the designated correction value, for example, based on the command sequence such as the command set CS6.

Figure 31:
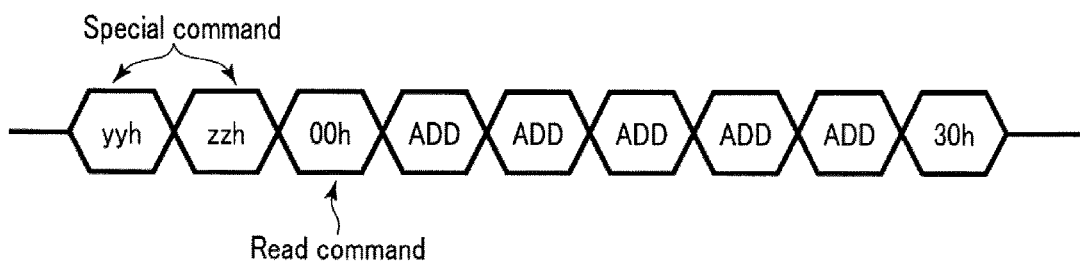
FIG. 31 is a different command sequence of the read operation of the memory system that may be applied in the third modification example.

In the operation described with reference to FIG. 27 and FIG. 28, a seventh command set CS7 as illustrated in FIG. 31 may be used instead of the sixth command set CS6. As illustrated in FIG. 31, the command set CS7 is similar to the command set CS6 illustrated in FIG. 29, except that a special command "yyh" is issued before a special command "zzh". As described above, the memory system 1 can simultaneously use a plurality of special commands. In this case, for example, a shift read by the read voltage designated by the controller 20 is instructed by the command "yyh", and the correction value designated with the Set feature or the Parameter set is applied by the command "zzh", with the level of the read voltage designated by the command "yyh" as a reference.

In the above embodiment, a method by which the controller 20 calculates the optimum read voltage is described in, for example, U.S. patent application Ser. No. 15/195,560, filed on Jun. 28, 2016, entitled "SEMICONDUCTOR MEMORY DEVICE." This patent application is incorporated herein by reference in its entirety.

In the input/output signal I/O illustrated in FIG. 9, FIG. 14, FIG. 16, FIG. 18, FIG. 21, FIG. 25, FIG. 26, and FIG. 28 used in the above description, only the command set CS sent from the controller 20 to the semiconductor memory device 10 is illustrated, and the read data DAT sent from the semiconductor memory device 10 to the controller 20 is omitted.

In addition, in the above description, the commands "xxh", "yyh", and "zzh" illustrated in FIG. 10, FIG. 11, FIG. 12, FIG. 29, and FIG. 31 are only examples, and it is possible to assign a different name to each of them.

In the above description, "read voltage" corresponds to the voltage applied when data is read out. That is, for example, in the waveform diagram illustrated in FIG. 9, the voltage applied to the selected word line during the tracking read is expressed in a stepwise manner, but this voltage may be continuously increased. In this case, data is read by matching the timing to assert the signal STB to the timing in which the read voltage is applied.

In the above description, the term "connection" indicates electrical connection, and includes not only a case of being connected directly but also a case of being connected through any element.

In the above embodiment, the memory cell array 11 may have a structure in which memory cell transistors MT are three-dimensionally stacked above a semiconductor substrate. Such a configuration is described in, for example, U.S. patent application Ser. No. 12/407,403 filed on Mar. 19, 2009, entitled "THREE DIMENSIONAL STACKED NON-VOLATILE SEMICONDUCTOR MEMORY," U.S. patent application Ser. No. 12/406,524, filed on Mar. 18, 2009, entitled "THREE DIMENSIONAL STACKED NON-VOLATILE SEMICONDUCTOR MEMORY," U.S. patent application Ser. No. 12/679,991, filed on Mar. 25, 2010, entitled "NON-VOLATILE SEMICONDUCTOR STORAGE DEVICE AND METHOD OF MANUFACTURING THE SAME," and U.S. patent application Ser. No. 12/532,030, filed on Mar. 23, 2009, entitled "SEMICONDUCTOR MEMORY AND METHOD FOR MANUFACTURING SAME." These patent applications are incorporated herein by reference in their entirety.

Further, in the above embodiment, the block BLK may be an erase unit of data. However, other erasing operations may be employed. They are described in U.S. patent application Ser. No. 13/235,389, filed on Sep. 18, 2011, entitled "NON-VOLATILE SEMICONDUCTOR MEMORY DEVICE," and U.S. patent application Ser. No. 12/694,690, filed on Jan. 27, 2010, entitled "NON-VOLATILE SEMICONDUCTOR STORAGE DEVICE." These patent applications are incorporated herein by reference in their entirety.

Further, it is possible to apply the method described in U.S. patent application Ser. No. 13/544,147 filed on Jul. 9, 2012 entitled "SEMICONDUCTOR MEMORY DEVICE WHICH STORES MULTIVALUED DATA," to the details of the tracking read in the above embodiment. The content of this patent application is incorporated herein by reference in its entirety.

Further, in the above respective embodiments, (1) In the read operation, the voltage applied to the word line selected for the read operation of "A" level is in a range of, for example, from 0 to 0.55 V. The voltage is not limited thereto, and may be in a range of any one of from 0.1 to 0.24 V, from 0.21 to 0.31 V, from 0.31 to 0.4 V, from 0.4 to 0.5 V, and from 0.5 to 0.55 V.

The voltage applied to the word line selected for the read operation of "B" level is in a range of, for example, from 1.5 to 2.3 V. The voltage is not limited thereto, and may be in a range of any one of from 1.65 to 1.8 V, from 1.8 to 1.95 V, from 1.95 to 2.1 V, and from 2.1 to 2.3 V.

The voltage applied to the word line selected for the read operation of "C" level is in a range of, for example, from 3.0 to 4.0 V. The voltage is not limited thereto, and may be in a range of any one of from 3.0 to 3.2 V, from 3.2 to 3.4 V, from 3.4 to 3.5 V, from 3.5 to 3.6 V, and from 3.6 to 4.0 V.

The time (tRead) of the read operation may be in a range of, for example, from 25 to 38 µs, from 38 to 70 µs, or from 70 to 80 µs.

(2) The write operation includes the program operation and the verification operation as described above. In the write operation, the voltage first applied to the word line selected for the program operation is in a range of, for example, from 13.7 to 14.3 V. The voltage is not limited thereto, and may be in a range of, for example, any one of from 13.7 to 14.0 V, and from 14.0 to 14.6 V.

The voltage first applied to the selected word line when writing to an odd-numbered word line and the voltage first applied to the selected word line when writing to an even-numbered word line may be changed.

When the program operation is set to the incremental step pulse program (ISPP) method, the voltage of the step-up is, for example, about 0.5 V.

The voltage applied to the unselected word line may be in a range of, for example, from 6.0 to 7.3 V. The voltage is not limited thereto, and may be, for example, from 7.3 to 8.4 V, or less than 6.0 V.

The bus voltage to be applied may be changed, depending on whether the unselected word line is an odd-numbered word line or an even-numbered word line.

The time (tProg) of the write operation may be in a range of, for example, from 1,700 to 1,800 µs, from 1,800 to 1,900 µs, or from 1,900 to 2,000 µs.

(3) In the erasing operation, the voltage to be first applied to a well which is formed at the top of the semiconductor substrate and on which the memory cell is placed is, for example, from 12.0 to 13.6 V. The voltage is not limited thereto, and may be in a range of, for example, any one of from 13.6 to 14.8 V, from 14.8 to 19.0 V, from 19.0 to 19.8 V, and from 19.8 to 21.0 V.

The time (tErase) of the erasing operation may be in a range of, for example, from 3,000 to 4,000 µs, from 4,000 to 5,000 µs, or from 4,000 to 9,000 µs.

(4) The structure of the memory cell has a charge storage layer placed on a semiconductor substrate (silicon substrate) through a tunnel insulating film having a thickness of from 4 to 10 nm. This charge storage layer can be made as a stacked structure of an insulating film of Sin, SiON, or the like having a thickness of from 2 to 3 nm and a polysilicon film having a thickness of from 3 to 8 nm. Further, metal of Ru or the like may be added to the polysilicon. An insulating film is placed on the charge storage layer. The insulating film has, for example, a silicon oxide film having a thickness of from 4 to 10 nm interposed between a lower high-k film having a film thickness of from 3 to 10 nm and an upper high-k film having a thickness of from 3 to 10 nm. The high-k film is HfO or the like. In addition, the thickness of the silicon oxide film can be made thicker than the thickness of the high-k film. A control electrode having a thickness of from 30 to 70 nm is formed on the insulating film through a material having a thickness of from 3 to 10 nm. Here, the material is a metal oxide film of TAO or the like, or a metal nitride film of TAn or the like. W or the like can be used for the control electrode.

In addition, an air gap can be formed between memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a memory cell array including first memory cells, second memory cells and third memory cells;
    a first word line connected to gates of the first memory cells;
    a second word line connected to gates of the second memory cells;
    a third word line connected to gates of the third memory cells; and
    a control circuit configured to execute a first read operation in response to a first command set, a second read operation in response to a second command set following the first command set, and a third read operation in response to a third command set following the first command set, wherein
    the first read operation includes a first read sequence, in which the control circuit applies at least first to third voltages which are different from each other, to the first word line,
    in the second read operation, the control circuit reads data from the second memory cells by applying a first read voltage that is set based on the result of the first read sequence of the first read operation, to the second word line, and
    in the third read operation, the control circuit reads data from the third memory cells by applying a second read voltage that is set independently of the result of the first read sequence, to the third word line.

2. The device according to claim 1, wherein the third command set includes a read command that is to be read by the control circuit prior to reading address information that is also included in the third command set.

3. The device according to claim 2, wherein
    the first command set includes a first special command and a read command, the first special command to be read by the control circuit prior to reading the read command in the first command set, and the read command in the first command set to be read by the control circuit prior to reading address information that is also included in the first command set, and
    the second command set includes a second special command and a read command, the second special command to be read by the control circuit prior to reading the read command in the second command set, and the read command in the second command set to be read by the control circuit prior to reading address information that is also included in the second command set.

4. The device according to claim 1, wherein the first read operation includes a second read sequence, in which the control circuit reads the data from the first memory cells by applying a third read voltage that is set based on the result of the first read sequence.

5. The device according to claim 1, further comprising
    a fourth word line connected to gates of fourth memory cells of the memory cell array; and
    a fifth word line connected to gates of fifth memory cells of the memory cell array, wherein
    the control circuit is configured to execute a fourth read operation in response to a fourth command set, and a fifth read operation in response to a fifth command set following the fourth command set,
    the fourth read operation including a third read sequence, in which the control circuit applies at least fourth to sixth voltages which are different from each other, to the fourth word line, and
    in the fifth read operation, the control circuit reading data from the fifth memory cells by applying a third read voltage that is set based on the result of the third read sequence of the fourth read operation, to the fifth word line.

6. The device according to claim 5, wherein the third read voltage is different from the second read voltage.

7. The device according to claim 5, wherein
    the first and fourth command sets each include a first special command and the second and fifth command sets each include a second special command, and
    the first special command is to be read by the control circuit prior to reading a read command that is also included in the fourth command set, and the second special command is to be read by the control circuit prior reading a read command that is also included in the fifth command set.

8. A memory system comprising a controller and a semiconductor memory device of claim 1.

9. A semiconductor memory device comprising:
    a memory cell array including first memory cells, second memory cells, third memory cells and fourth memory cells;
    a first word line connected to gates of the first memory cells;
    a second word line connected to gates of the second memory cells;
    a third word line connected to gates of the third memory cells;
    a fourth word line connected to gates of the fourth memory cells; and
    a control circuit is configured to execute a first read operation in response to a first command set, a second read operation in response to a second command set following the first command set, a third read operation in response to a third command set following the second command set and a fourth read operation in response to a fourth command set following the third command set; wherein
    the first read operation includes a first read sequence, in which the control circuit applies at least first to third voltages which are different from each other, to the first word line,
    in the second read operation, the control circuit reads data from the second memory cells by applying a first read voltage, to the second word line,
    the third read operation includes a third read sequence, in which the control circuit applies at least fourth to sixth voltages which are different from each other, to the third word line, and in the fourth read operation, the control circuit reads data from the fourth memory cells by applying a second read voltage, to the fourth word line, wherein the second command set and the fourth command set each include a special command and a read command that is to be read by the control circuit prior to reading address information also included in the respective second or fourth command set, and the first read voltage is different from the second read voltage.

10. The device according to claim 9, wherein the first command set and the third command set each include a special command and a read command that is to be read by the control circuit prior to reading address information also included in the respective first or third command set.

11. The device according to claim 9, wherein the first read operation includes a second read sequence, in which the control circuit reads the data from the first memory cells by applying a third read voltage that is set based on the result of the first read sequence, and the third read operation includes a fourth read sequence, in which the control circuit reads the data from the third memory cells by applying a fourth read voltage that is set based on the result of the third read sequence.

12. The device according to claim 11, wherein the first read voltage is set based on the third read voltage and the second read voltage is set based on the fourth read voltage.

13. A memory system comprising a controller and a semiconductor memory device of claim 9.

14. A method of performing a read operation in a semiconductor memory device comprising a memory cell array including first memory cells, second memory cells and third memory cells, a first word line connected to gates of the first memory cells, a second word line connected to gates of the second memory cells, and a third word line connected to gates of the third memory cells, said method comprising:

in response to a first command set, executing a first read sequence during which at least first to third voltages which are different from each other are applied to the first word line;

in response to a second command set following the first command set, reading data from the second memory cells by applying a first read voltage that is set based on the result of the first read sequence, to the second word line; and in response to a third command set following the first command set, reading data from the third memory cells by applying a second read voltage that is set independently of the result of the first read sequence, to the third word line.

15. The method according to claim 14, wherein the third command set includes a read command that is to be read prior to reading address information that is also included in the third command set.

16. The method according to claim 15, wherein the first command set includes a first special command and a read command, the first special command to be read prior to reading the read command in the first command set, and the read command in the first command set to be read prior to reading address information that is also included in the first command set, and the second command set includes a second special command and a read command, the second special command to be read prior to reading the read command in the second command set, and the read command in the second command set to be read prior to reading address information that is also included in the second command set.

17. The method according to claim 14, further comprising:

in response to the first command set and after executing the first read sequence, executing a second read sequence during which data from the first memory cells are read by applying a third read voltage that is set based on the result of the first read sequence.

* * * * *